(12) United States Patent
Obata et al.

(10) Patent No.: US 9,793,875 B2
(45) Date of Patent: Oct. 17, 2017

(54) VIBRATION ELEMENT, VIBRATOR, OSCILLATOR, ELECTRONIC APPARATUS, AND MOVING OBJECT

(71) Applicant: Seiko Epson Corporation, Tokyo (JP)

(72) Inventors: Naohisa Obata, Minowa (JP); Yusuke Yamamoto, Minowa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/801,071

(22) Filed: Jul. 16, 2015

(65) Prior Publication Data

US 2016/0020748 A1 Jan. 21, 2016

(30) Foreign Application Priority Data

Jul. 17, 2014 (JP) ................ 2014-146541

(51) Int. Cl.
| | |
|---|---|
| *H03B 5/32* | (2006.01) |
| *H03H 9/19* | (2006.01) |
| *H03H 9/02* | (2006.01) |
| *H03H 9/05* | (2006.01) |
| *H03H 9/13* | (2006.01) |
| *H01L 41/047* | (2006.01) |

(52) U.S. Cl.
CPC .......... *H03H 9/19* (2013.01); *H03H 9/02023* (2013.01); *H03H 9/02102* (2013.01); *H03H 9/02133* (2013.01); *H03H 9/0519* (2013.01); *H03H 9/132* (2013.01); *H01L 41/047* (2013.01); *H03B 5/32* (2013.01)

(58) Field of Classification Search
CPC .. H03H 9/19; H03H 9/02023; H03H 9/02102; H03H 9/02133; H03H 9/0519; H03H 9/132; H03B 5/32; H01L 41/047

USPC ........ 310/367, 368; 331/73, 108 C, 154, 158
See application file for complete search history.

(56) References Cited

U.S. PATENT DOCUMENTS

| | | | |
|---|---|---|---|
| 2007/0252480 | A1 | 11/2007 | Tsuchido |
| 2010/0327705 | A1 | 12/2010 | Koyama |
| 2012/0306321 | A1 | 12/2012 | Ishii |
| 2013/0043959 | A1* | 2/2013 | Ishii ................. H03H 9/0542 331/158 |

(Continued)

FOREIGN PATENT DOCUMENTS

| | | |
|---|---|---|
| JP | 10-321640 A | 12/1998 |
| JP | 2003-198300 A | 7/2003 |

(Continued)

*Primary Examiner* — Richard Tan
(74) *Attorney, Agent, or Firm* — Harness, Dickey & Pierce, P.L.C.

(57) ABSTRACT

A vibration element includes a substrate having first and second principal surfaces, a first excitation electrode on the first principal surface, a second excitation electrode on the second principal surface, and a first extraction electrode on the first principal surface, and connected to the first excitation electrode. The first extraction electrode includes a first electrode section, and a second electrode section extending from the first electrode section in a first direction and connected to the first excitation electrode. The second electrode section is narrower in a second direction than the first electrode section. When an area of the first excitation electrode is S1, and an area of an overlapping part where the second electrode section overlaps the second excitation electrode is S2, $(S2/S1) \leq 0.1$.

17 Claims, 20 Drawing Sheets

(56) References Cited

U.S. PATENT DOCUMENTS

2013/0257554 A1\* 10/2013 Ishii .................... H03B 5/32
331/158

FOREIGN PATENT DOCUMENTS

| | | |
|---|---|---|
| JP | 2006-311015 A | 11/2006 |
| JP | 2007-325250 A | 12/2007 |
| JP | 2010-103963 A | 5/2010 |
| JP | 2011-087075 A | 4/2011 |
| JP | 2011-160094 A | 8/2011 |
| JP | 2012-253630 A | 12/2012 |
| JP | 2013-046085 A | 3/2013 |
| JP | 2013-157702 A | 8/2013 |
| JP | 2014-138414 A | 7/2014 |
| WO | WO-2009-020022 A1 | 2/2009 |
| WO | WO-2013-027381 A1 | 2/2013 |

\* cited by examiner

VIBRATION ELEMENT, VIBRATOR, OSCILLATOR, ELECTRONIC APPARATUS, AND MOVING OBJECT

BACKGROUND

1. Technical Field

The present invention relates to a vibration element, and a vibrator, an oscillator, an electronic apparatus, and a moving object each provided with the vibration element.

2. Related Art

An AT-cut quartz crystal vibrator for exciting a thickness-shear vibration as a principal vibration mode is suitable for miniaturization and high frequency. The AT-cut quartz crystal vibrator also has a frequency-temperature characteristic showing an excellent cubic curve. In view of the foregoing, an AT-cut quartz crystal vibrator is used in a variety of fields such as oscillators and electronic apparatuses. In particular, in recent years, due to the increase in processing speed of transmission communication equipment and OA equipment, or the increase in communication data capacity and processing amounts, a demand for increasing the frequency to the AT-cut quartz crystal vibrator used as a reference frequency signal source is increasing. One known technique for achieving a higher-frequency vibration is by decreasing the thickness of the vibrating part vibrating in the thickness-shear vibration mode.

JP-A-2012-253630 discloses an AT-cut quartz crystal vibration element which achieves a high-frequency vibration using an inverted-mesa structure having a thin-wall vibrating section and a thick-wall section disposed throughout the entire circumference of the outer edge of the vibrating section. This AT-cut quartz crystal vibration element includes a pair of excitation electrodes respectively disposed on a first principal surface and a second principal surface of the vibrating section in an opposed relationship to each other. Further, a pair of extraction electrodes extend from the respective excitation electrodes. In a plan view (also referred to as "the planar view") of the vibration element, the pair of excitation electrodes have different sizes, and the larger excitation electrode entirely overlaps the smaller excitation electrode.

Since the vibration element described in JP-A-2012-253630 has an area where the extraction electrode extending from the smaller excitation electrode and the extraction electrode extending from the larger excitation electrode overlap each other, there is a possibility that this area may function as a vibration area in addition to the vibration area sandwiched by the pair of excitation electrodes. This may cause an unwanted spurious frequency near the resonant frequency.

SUMMARY

An advantage of some aspects of the invention is to solve at least a part of the problems described above, and the invention can be implemented as the following aspects or application examples.

Application Example 1

This application example is directed to a vibration element including a substrate having a first principal surface and a second principal surface in an opposed relationship to each other, a first excitation electrode disposed on the first principal surface, a second excitation electrode disposed on the second principal surface, and a first extraction electrode disposed on the first principal surface, and connected to the first excitation electrode, the first extraction electrode includes a first electrode section, and a second electrode section extending from the first electrode section in a first direction, and connected to the first excitation electrode, the second electrode section is narrower in width in a second direction intersecting with the first direction than the first electrode section, and assuming that an area of the first excitation electrode is S1, and an area of an overlapping part where the second electrode section overlaps the second excitation electrode is S2 in a planar view, the following is fulfilled.

$$(S2/S1) \leq 0.1$$

With this configuration, a vibration element capable of reducing the generation of the unwanted spurious frequency near the resonant frequency can be obtained.

Application Example 2

This application example is directed to the vibration element according to the application example described above, wherein a length of the overlapping part along the first direction is equal to or shorter than 20 μm.

With this configuration, the resistance of the extraction electrode can be reduced.

Application Example 3

This application example is directed to the vibration element according to the application example described above, wherein the first excitation electrode is disposed within a range of the second excitation electrode in a planar view.

With this configuration, the desired vibration characteristics can be stably exerted.

Application Example 4

This application example is directed to the vibration element according to the application example described above, wherein, assuming that a thickness of the substrate is t, and a length of the first excitation electrode along the second direction is a, the following is fulfilled.

$$(-1049 \times t + 57) \leq (a/t) \leq (-64.4 \times t + 57)$$

With this configuration, stable vibration characteristics can be obtained.

Application Example 5

This application example is directed to the vibration element according to the application example described above, wherein, assuming that a thickness of the substrate is t, and a length of the first excitation electrode along the first direction is b, the following is fulfilled.

$$(-823 \times t + 42) \leq (b/t) - (-120 \times t + 42)$$

With this configuration, stable vibration characteristics can be obtained.

Application Example 6

This application example is directed to a vibrator including the vibration element according to the application example described above, and a package adapted to house the vibration element.

According to this application example, a vibrator with high reliability can be obtained.

Application Example 7

This application example is directed to an oscillator including the vibration element according to the application example described above, and a circuit adapted to drive the vibration element.

According to this application example, an oscillator with high reliability can be obtained.

Application Example 8

This application example is directed to an electronic apparatus including the vibration element according to the application example described above.

According to this application example, an electronic apparatus high in reliability can be obtained.

Application Example 9

This application example is directed to a moving object including the vibration element according to the application example described above.

According to this application example, a moving object high in reliability can be obtained.

BRIEF DESCRIPTION OF THE DRAWINGS

Embodiments of the invention will be described with reference to the accompanying drawings, wherein like numbers reference like elements.

FIGS. 1A through 1C are diagrams showing a schematic configuration of a vibration element according to a first embodiment of the invention, wherein FIG. 1A is a schematic plan view, FIG. 1B is a schematic cross-sectional view along the P-P line, and FIG. 1C is a schematic cross-sectional view along the Q-Q line.

FIGS. 17A through 17C are diagrams showing a schematic configuration of a vibration element according to a sixth embodiment of the invention, wherein FIG. 17A is a schematic plan view, FIG. 17B is a schematic cross-sectional view along the P-P line, and FIG. 17C is a schematic cross-sectional view along the Q-Q line.

DESCRIPTION OF EXEMPLARY EMBODIMENTS

Figure 1A:
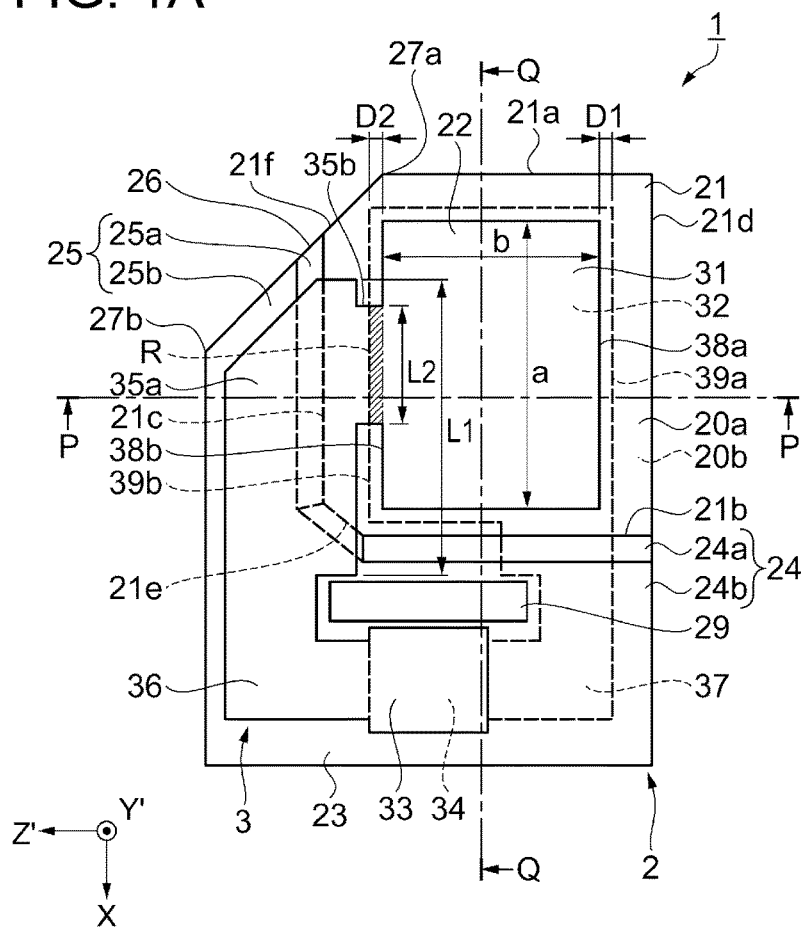

Some embodiments of the invention will hereinafter be explained in detail based on the accompanying drawings. It should be noted that in the drawings described hereinafter, the dimensions and the ratios of the constituents are arbitrarily made different from those of the actual constituents in some cases in order to provide the constituents with recognizable sizes in the drawings.

Vibration Element

First Embodiment

Firstly, as an example of a vibration element according to a first embodiment of the invention, there is cited a vibration element having an inverted-mesa structure having a recessed section in the central portion of a substrate, and a schematic configuration of the vibration element will be explained with reference to FIGS. 1A through 1C. It should be noted that in each of the subsequent drawings for explaining the schematic configuration of the vibration element, there are shown X axis, Y' axis, and Z' axis as three axes perpendicular to each other, and the tip side of the arrow shown in the drawing is defined as "+ side," and the base end side is defined as "− side" for the sake of convenience of explanation. Further, a direction parallel to the X axis is referred to as an "X-axis direction," a direction parallel to the Y axis is referred to as a "Y-axis direction," and a direction parallel to the Z axis is referred to as a "Z-axis direction." Further, the explanation will be presented assuming that the principal surface on the side provided with the recessed section is a first principal surface 20a, and the principal surface on the planar side is a second principal surface 20b.

Figure 1C:
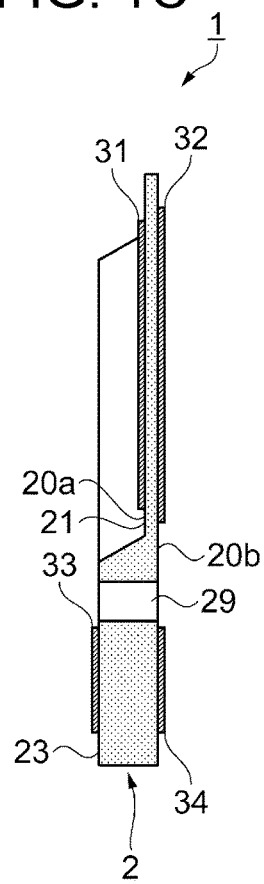
Figure 1B:
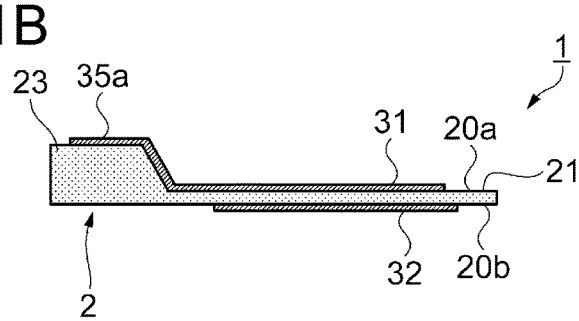
Figure 2:
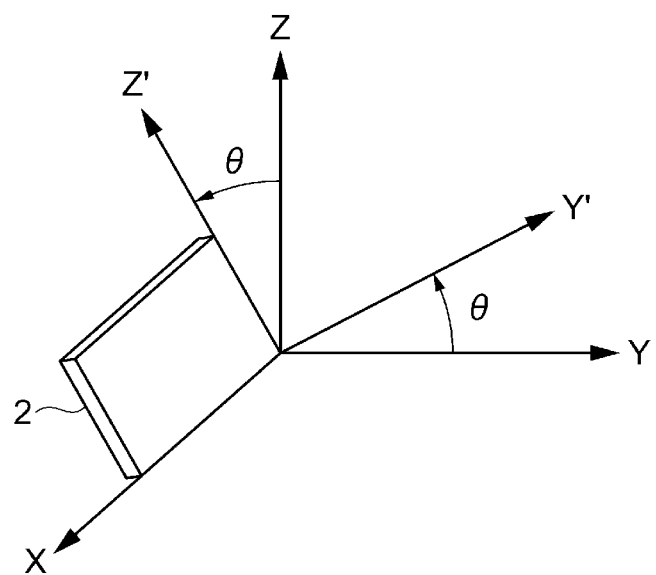
FIG. 2 is a diagram for explaining a relationship between an AT-cut quartz crystal substrate and crystal axes of a quartz crystal.
Figure 3:
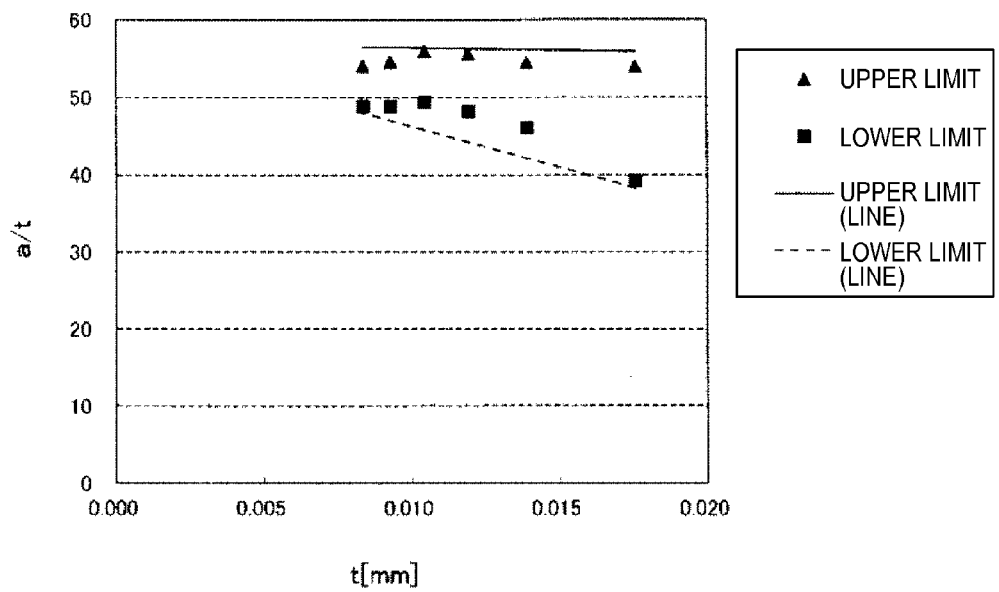
FIG. 3 is a graph showing a relationship between the thickness of a vibrating section and the size of an excitation electrode.
Figure 4:
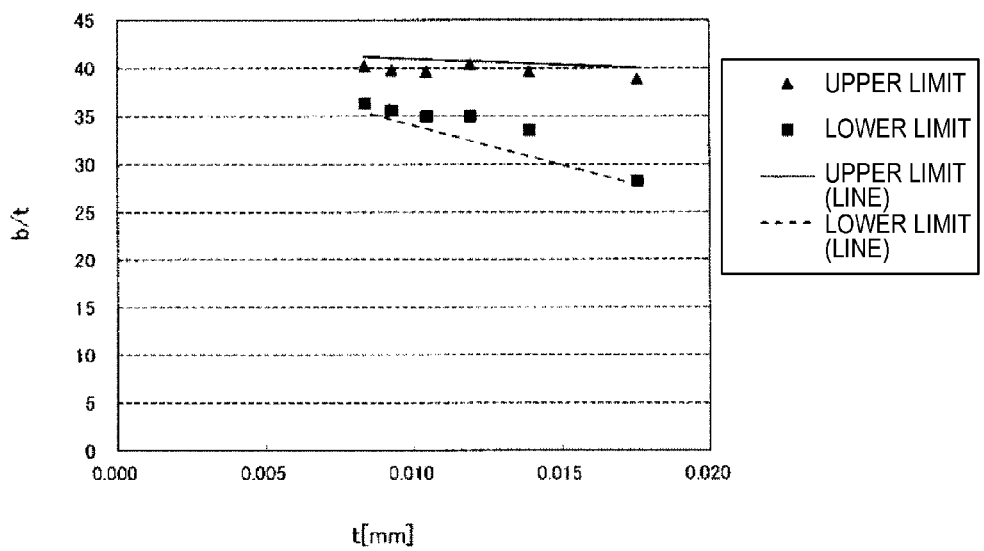
FIG. 4 is a graph showing a relationship between the thickness of the vibrating section and the size of the excitation electrode.

FIGS. 1A through 1C are diagrams showing a schematic configuration of a vibration element according to the first embodiment of the invention, wherein FIG. 1A is a schematic plan view of the vibration element, FIG. 1B is a schematic cross-sectional view along the P-P line in FIG. 1A, and FIG. 1C is a schematic cross-sectional view along the Q-Q line in FIG. 1A. FIG. 2 is a diagram for explaining a relationship between an AT-cut quartz crystal substrate and crystal axes of a quartz crystal. FIGS. 3 and 4 are each a graph showing a relationship between the thickness of the vibrating section and the size of the excitation electrode.

As shown in FIGS. 1A through 1C, the vibration element 1 has a substrate 2, and electrodes 3 formed on the substrate 2.

Substrate

The substrate 2 is a crystal substrate having a plate-like shape. Here, the quartz crystal as the material of the substrate 2 belongs to a trigonal system, and has crystal axes X, Y, and Z perpendicular to each other as shown in FIG. 2. The X axis, the Y axis, and the Z axis are called an electrical axis, a mechanical axis, and an optical axis, respectively. The substrate 2 of the present embodiment is a "rotated Y-cut quartz crystal substrate" carved out along a plane obtained by rotating the X-Z plane around the X axis as much as a predetermined angle θ, and for example, the substrate, which is curved out along a plane obtained by the rotation as much as θ=35°15', is referred to as an "AT-cut quartz crystal substrate." By using such a quartz crystal substrate, the vibration element 1 having superior temperature characteristics is obtained.

It should be noted that the substrate 2 is not limited to the AT-cut substrate providing the thickness-shear vibration can be excited, and for example, a BT-cut substrate can also be used.

It should be noted that the Y axis and the Z axis rotated around the X axis in accordance with the angle θ are hereinafter referred to as the Y' axis and the Z' axis, respectively. In other words, the substrate 2 has thickness in the Y'-axis direction, and spread in the X-Z' plane direction.

Further, the explanation will be presented assuming that a first direction is a direction along the Z' axis, and a second direction intersecting with the first direction is a direction along the X axis.

The substrate 2 has a first principal surface 20a and a second principal surface 20b in an opposed relationship to each other, and has a roughly elongated shape having a long side in a direction along the X axis as the second direction and a short side in a direction along the Z' axis as the first direction in a planar view. Further, the substrate 2 has a tip side in the −X-axis direction and a base end side in the +X-axis direction. Assuming in the substrate 2 that the maximum length in a direction along the X axis is L, and the maximum width in a direction along the Z' axis is W, the value (L/W) is not particularly limited, but is preferably set to, for example, about 1.1 through 1.4.

As shown in FIGS. 1A through 1C, the substrate 2 has a vibrating section 21 including a thin-wall vibrating area (an area in which the vibration energy is confined) 22, and a thick-wall section 23, which is integrated with the vibrating section 21 and is larger in thickness than the vibrating area 22. The vibrating section 21 can be formed by, for example, forming a recessed section on the first principal surface 20a of the crystal substrate on the +Y'-axis side using wet etching.

The vibrating section 21 is displaced toward the −X-axis direction and the −Z'-axis direction from the center of the substrate 2, and apart of an outer edge of the vibrating section 21 is exposed from the thick-wall section 23. Here, it is preferable that the area of the vibrating section 21 is equal to or smaller than half the area of the substrate 2 in a planar view of the vibration element 1. Thus, the thick-wall section 23 larger in wall-thickness and higher in mechanical strength than the vibrating section 21 can be formed to be sufficiently large, and therefore, the rigidity of the vibration element 1 (the vibrating section 21) can be sufficiently ensured. Therefore, the distortion in the thickness direction of the substrate 2 due to acceleration (a vibration and an impact) in the Y'-axis direction can be effectively reduced, and the sensitivity with respect to the acceleration in the Y'-axis direction can be made obtuse. Further, generation of an unwanted vibration mode and so on can be effectively reduced. Further, assuming in the vibrating section 21 that the maximum length in a direction along the X axis is Lb, and the maximum width in a direction along the Z' axis is Wb, the value (Lb/Wb) is not particularly limited, but is preferably set to, for example, about 1.2 through 1.35. Thus, the vibration energy of the thickness-shear vibration as a principal vibration can be efficiently confined in the excitation electrode.

The vibrating section 21 has a pair of first outer edges 21a, 21b separated from each other in the X-axis direction (the vibration direction of the thickness-shear vibration) and extending in the Z'-axis direction (the direction intersecting with the X-axis direction) in the planar view of the vibration element 1, and a pair of second outer edges 21c, 21d separated from each other in the Z'-axis direction and extending in the X-axis direction. Among the first outer edges 21a, 21b, the first outer edge 21a is located on the −X-axis side, and the first outer edge 21b is located on the +X-axis side. Further, among the second outer edges 21c, 21d, the second outer edge 21c is located on the +Z'-axis side, and the second outer edge 21d is located on the −Z'-axis side.

Further, the vibrating section 21 has a third outer edge 21e for connecting an end of the first outer edge 21b located on the +Z'-axis side and an end of the second outer edge 21c located on the +X-axis side to each other. The third outer edge 21e is disposed so as to intersect with both of the X axis and the Z' axis. The tilted angle of the third outer edge 21e with respect to the X axis is not particularly limited, but is preferably in a range of no larger than about 30° and no smaller than about 65°. By providing such a third outer edge 21e, with respect to, for example, the stress due to mounting to a base substrate such as a package caused when mounting is performed using areas in the vicinities of pad electrodes 33, 34 of a thick-wall section main body 24b of a first thick-wall section 24 as fixation sections, stress concentration near a boundary section between the first outer edge 21b and the second outer edge 21c can be relaxed, and therefore, the distortion caused in the vibrating section 21 due to the stress can be reduced. Therefore, the vibration characteristics of the vibration element 1 can be improved.

Further, the vibrating section 21 further has a fourth outer edge 21f for connecting an end of the first outer edge 21a located on the +Z'-axis side and an end of the second outer edge 21c located on the −X-axis side to each other. The fourth outer edge 21f is configured as a part of an outer edge section 26 described later.

As shown in FIGS. 1A through 1C, the obverse (front) surface (the principal surface on the +Y'-axis direction side) of the thick-wall section 23 is disposed so as to project toward the +Y'-axis direction side from the surface (the principal surface on the +Y'-axis direction side) of the vibrating section 21. In contrast, the reverse surface (the principal surface on the −Y'-axis direction side) of the thick-wall section 23 is disposed coplanar with the reverse surface (the principal surface on the −Y'-axis direction side) of the vibrating section 21.

The thick-wall section 23 has the first thick-wall section 24 disposed along the first outer edge 21b, and a second thick-wall section 25 disposed along the second outer edge 21c and the third outer edge 21e and connected to the first thick-wall section 24. Therefore, the thick-wall section 23 is provided with a structure of bending along the vibrating section 21 in the planar view, and has a roughly L shape. In contrast, the first outer edge 21a, the second outer edge 21d, and the fourth outer edge 21f of the vibrating section 21 are each not provided with the thick-wall section 23, and are exposed from the thick-wall section 23. As described above, by partially providing the thick-wall section 23 on the outer edge of the vibrating section 21 to have a roughly L shape, and preventing the thick-wall section 23 from being disposed along the first outer edge 21a, the second outer edge 21d, and the fourth outer edge 21f, it is possible to reduce the mass of the tip side of the vibration element 1 while keeping the rigidity of the vibration element 1 (the vibrating section 21). Further, miniaturization of the vibration element 1 can be achieved.

Here, by providing the first thick-wall section 24 on the +X-axis side with respect to the vibrating section 21, the width (the length in the X-axis direction) of a tilted section 24a described later can be shortened compared to the case of providing the first thick-wall section 24 on the −X-axis side. Similarly, by providing the second thick-wall section 25 on the +Z'-axis side with respect to the vibrating section 21, the width (the length in the Z'-axis direction) of a tilted section 25a described later can be shortened compared to the case of providing the second thick-wall section 25 on the −Z'-axis side. Therefore, according to such a thick-wall section 23, miniaturization of the vibration element 1 can be achieved.

The first thick-wall section 24 is provided with the tilted section (a residual section) 24a disposed contiguously with the first outer edge 21b and gradually increasing in the thickness in the +X-axis direction, and the thick-wall section main body 24b disposed contiguously with the +X-axis direction side edge of the tilted section 24a and having roughly constant thickness. Similarly, the second thick-wall section 25 is provided with the tilted section (a residual section) 25a disposed contiguously with the second outer edge 21c and the third outer edge 21e and gradually increasing in the thickness in the +Z'-axis direction, and a thick-wall section main body 25b disposed contiguously with the +Z'-axis direction side edge of the tilted section 25a and having roughly constant thickness. Further, the second thick-wall section 25 has the outer edge section 26, which extends in a direction intersecting with both of the X axis and the Z' axis in the planar view of the vibration element 1, at the tip portion of the second thick-wall section 25.

The outer edge section 26 is disposed so as to cut the corners located on the −X-axis side and +Z'-axis side of the substrate 2. The outer edge section 26 is formed so as to connect an end portion 27a and an end portion 27b to each other, and to straddle the thick-wall section main body 25b, the tilted section 25a, and the vibrating section 21. Therefore, in the outer edge section 26, the end portion 27a located on the tip side is located in the vibrating section 21, and as described above, a part of the end portion 27a constitutes the fourth outer edge 21f. By providing such an outer edge section 26, as described later, it is possible to obtain the vibration element 1 obtuse in sensitivity with respect to the acceleration (a vibration, an impact) in the Y'-axis direction, namely difficult to be affected by the acceleration in the Y'-axis direction.

Further, the thick-wall section main body 24b of the first thick-wall section 24 is provided with a slit 29 penetrating the substrate 2. By providing such a slit 29, with respect to the stress due to mounting to the base substrate such as the package caused when mounting is performed using the areas in the vicinities of the pad electrodes 33, 34 as the fixation sections, the stress concentration near the boundary section between the first outer edge 21b and the second outer edge 21c can further be relaxed, and therefore the distortion caused in the vibrating section 21 due to the stress can be dramatically reduced. Therefore, the vibration characteristics of the vibration element 1 can be dramatically improved.

Electrodes

The electrodes 3 include a first excitation electrode 31, a second excitation electrode 32, the pad electrodes 33, 34, a first extraction electrode 36, and a second extraction electrode 37. The first excitation electrode 31 is formed on the first principal surface 20a of the vibrating area 22. On the other hand, the second excitation electrode 32 is disposed on the second principal surface 20b of the vibrating area 22 so as to be opposed to the first excitation electrode 31. The first excitation electrode 31 and the second excitation electrode 32 each have a roughly rectangular shape having the X-axis direction as a long side, and the Z'-axis direction as a short side.

Further, the first excitation electrode 31 and the second excitation electrode 32 have similar shapes to each other, and the second excitation electrode 32 located on the second principal surface 20b side is formed to be larger than the first excitation electrode 31 located on the first principal surface 20a side. Further, in the planar view of the vibration element 1, the first excitation electrode 31 is disposed within the boundary of the second excitation electrode 32. In other words, the entire area of the first excitation electrode 31 is inboard of the second excitation electrode 32 so that the respective outer edges (the contours) of the first and second excitation electrodes 31, 32 do not overlap each other. Thus, the desired vibration characteristics can be stably exerted.

Further, the first excitation electrode 31 and the second excitation electrode 32 are disposed so that the respective centers in the X-axis direction are aligned (are concentric), and at the same time the respective centers in the Z'-axis direction are aligned (are concentric) in the planar view of the vibration element 1. It should be noted that it is also possible for the first excitation electrode 31 to be formed so as to be displaced toward the −Z'-axis side with respect to the second excitation electrode 32. Specifically, the first excitation electrode 31 and the second excitation electrode 32 can also be disposed so that the distance D2 between the respective outer edges 38b, 39b of the first excitation electrode 31 and the second excitation electrode 32 located on the +Z'-axis side is smaller than the distance D1 between the respective outer edges 38a, 39a located on the −Z'-axis side.

The pad electrode 33 is formed on the front (e.g., obverse) surface of the thick-wall section main body 24b. In contrast, the pad electrode 34 is formed on the reverse surface of the thick-wall section main body 24b so as to be opposed to the pad electrode 33.

The first extraction electrode 36 extends from the first excitation electrode 31, and the first excitation electrode 31 and the pad electrode 33 are electrically connected to each other via the first extraction electrode 36. The first extraction electrode 36 is configured including a first electrode section 35a, and a second electrode section 35b extending from the first electrode section 35a in the Z'-axis direction and connected to the first excitation electrode 31. In the first extraction electrode 36, the second electrode section 35b extends from an outer edge 38b of the first excitation electrode 31 in the Z'-axis direction, then is connected to the first electrode section 35a, and then extracted to the obverse surface of the thick-wall section 23 via the tilted section 25a.

The second electrode section 35b of the first extraction electrode 36 is formed so that the width L2 in the X-axis direction intersecting with the Z'-axis direction is narrower than the width L1 of the first electrode section 35a. Thus, it is possible to make apart (an area R) where the second excitation electrode 32 and the second electrode section 35b overlap each other in the planar view of the vibration element 1, and thus, generation of the unwanted spurious frequency can be reduced. Further, by increasing the width L1 of the first electrode section 35a in the X-axis direction, increase in resistance value of the sheet resistance due to adoption of thin film electrode can be reduced. Specifically, in the first extraction electrode 36 and the second extraction electrode 37, by adopting an electrode pattern approximate to a square instead of a belt-like thin electrode pattern, the sheet resistance of the electrode is decreased to thereby reduce an ohmic loss, and thus, the vibration element 1 having a low crystal impedance (CI=an equivalent resistance of the vibrator) value can be obtained.

Further, the second extraction electrode 37 extends from the second excitation electrode 32, and the second excitation electrode 32 and the pad electrode 34 are electrically connected to each other via the second extraction electrode 37. In the planar view, the second extraction electrode 37 is disposed so as not to overlap the first extraction electrode 36 via the substrate 2. Thus, the capacitance between the first extraction electrode 36 and the second extraction electrode 37 can be suppressed.

Such electrodes 3 can be formed of a metal coating obtained by stacking Au (gold) or an alloy consisting primarily of Au on a foundation layer made of, for example, Cr (chromium) or Ni (nickel).

The configuration of the electrodes 3 is hereinabove explained. In the vibration element 1, there is formed the part (the area R) where the second excitation electrode 32 and the second electrode section 35b of the first extraction electrode 36 overlap each other in the planar view of the vibration element 1. Assuming that the area of the first excitation electrode 31 is S1, and the area of the overlapping part (the area R) is S2, the areas S1, S2 fulfill the relationship of (S2/S1)≤0.1. Thus, the overlapping part (the area R) can be made sufficiently small, and it is possible to keep the unwanted spurious frequency further from the resonant frequency of the vibration element 1. Therefore, the vibration element 1 capable of stably exerting superior vibration characteristics is obtained.

Specifically, it is conceivable that the overlapping part (the area R) forms a vibrating area other than (in addition to) the original vibrating area (an area sandwiched by the first excitation electrode 31 and the second excitation electrode 32), and the unwanted spurious frequency is generated from the overlapping part (the area R). Further, since there is shown a tendency that the larger the overlapping part (the area R) is, the closer the frequency of the unwanted spurious frequency approaches to the resonant frequency. By fulfilling the relationship of (S2/S1)≤0.1, the area S2 of the overlapping part (the area R) is made sufficiently small, and thus, the unwanted spurious frequency is kept further from the resonant frequency of the vibrating element 1.

The difference in frequency between the unwanted spurious frequency and the resonant frequency is not particularly limited, but is preferably equal to or larger than 1000 ppm. Thus, the vibration element 1 capable of stably exerting superior vibration characteristics is obtained. It should be noted that if (S2/S1)>0.1 is true, the overlapping part (the area R) becomes excessively large, the unwanted spurious frequency occurs near the resonant frequency, and it is impossible to stably exert superior vibration characteristics.

Although the vibration element 1 is not particularly limited as long as the relationship of (S2/S1)≤0.1 is fulfilled, it is preferable to fulfill the relationship of (S2/S1)≤0.07, and it is more preferable to fulfill the relationship of (S2/S1)≤0.05. With these relationships, the features described above can be more remarkably exerted.

The fact that the unwanted spurious frequency can be kept sufficiently far from the resonant frequency by fulfilling the relationship of (S2/S1)≤0.1 will be demonstrated based on an experimental result. The size of the substrate 2 of the vibration element 1 used for the experiment has the length (the length in the X-axis direction), the width (the length in the Z'-axis direction), and the thickness (the length in the Y'-axis direction) of 1.8 mm, 1.0 mm, and 0.05 mm, respectively. Further, the size of the vibrating section 21 has the length, the width, and the thickness of 1.0 mm, 0.9 mm, and 0.002 mm, respectively. Further, the size of the second excitation electrode 32 has the length, the width, and the thickness of 0.36 mm, 0.28 mm, and 0.000085 mm, respectively. Further, the size of the first excitation electrode 31 has the length, the width, and the thickness of 0.18 mm, 0.14 mm, and 0.000085 mm, respectively. Four types of Samples 1 through 4 in which the first excitation electrode 31 was displaced in the Z'-axis direction with respect to the second excitation electrode 32 were manufactured. The positions of the first excitation electrode 31 in Samples 1 through 4 are located on the +Z'-axis direction side in this order. The value (S2/S1) and the frequency difference Δf between the unwanted spurious frequency and the resonant frequency were obtained with respect to each of the four samples. The result is shown in Table 1 below. It should be noted that the numerical values shown in Table 1 each represent the average value of ten samples with respect to each of Samples 1 through 4.

TABLE 1

|  | S1 (mm$^2$) | S2 (mm$^2$) | S2/S1 | Δf (ppm) |
|---|---|---|---|---|
| Sample 1 | 0.025 | 0.0025 | 0.10 | 1021 |
| Sample 2 | 0.025 | 0.003 | 0.13 | 957 |

TABLE 1-continued

|  | S1 (mm$^2$) | S2 (mm$^2$) | S2/S1 | Δf (ppm) |
|---|---|---|---|---|
| Sample 3 | 0.025 | 0.010 | 0.40 | 838 |
| Sample 4 | 0.025 | 0.017 | 0.67 | 506 |

Table 1 shows that only the sample satisfying the relationship of (S2/S1)≤0.1, namely Sample 1, satisfies Δf≤1000 ppm, and the unwanted spurious frequency is kept sufficiently far from the resonant frequency. According to the experimental result described hereinabove, it was shown that by satisfying the relationship of (S2/S1)≤0.1, the unwanted spurious frequency could be kept sufficiently far from the resonant frequency.

Further, the distance D2 (i.e., the length of the overlapping part (the area R) in the Z'-axis direction) between the outer edges 38b, 39b of the first excitation electrode 31 and the second excitation electrode 32 described above is not particularly limited, but is preferably equal to or shorter than 20 μm, and more preferably equal to or shorter than 10 μm. Thus, the length of the second electrode section 35b in the overlapping part (the area R) can be made shorter, and therefore, the resistance of the first extraction electrode 36 can be decreased. Here, if the distance D2 is set to 0 (zero), the overlapping part (the area R) is not formed, which is therefore the most preferable from the viewpoint of keeping the unwanted spurious frequency far from the resonant frequency. However, from the viewpoint of the manufacture of the vibration element 1, it is preferable that the distance D2 is not 0 (zero).

In manufacturing the vibration element 1, it is possible for the formation positions of the first excitation electrode 31 and the second excitation electrode 32 to be displaced from the predetermined positions, and if the outer edge 38b of the first excitation electrode 31 runs off on the +Z'-axis side from the outer edge 39b of the second excitation electrode 32, the vibration characteristics of the vibration element 1 dramatically change, and at the same time, the performance of the vibration element 1 is also degraded dramatically. Therefore, it is preferable that the distance D2 is not equal to 0 (zero) so that outer edge 38b of the first excitation electrode 31 does not run off on the +Z'-axis side from the outer edge 39b of the second excitation electrode 32 even in the case in which the forming positions of the first excitation electrode 31 and the second excitation electrode 32 are displaced from the predetermined positions.

Further, the thickness t (mm) of the vibrating section 21 is standardized as follows. (t (mm))=(1670 (m/s))/(vibration frequency (kHz)). Further, as shown in Table 2, it is assumed that a lower limit value of the vibration frequency is F1, an upper limit value thereof is F2, and the center frequency of the lower limit and the upper limit is F3 in the case of using the same electrode dimensions. Further, the thickness of the vibrating section 21 is standardized as 1670/F1=t1, 1670/F2=t2, and 1670/F3=t3.

TABLE 2

|  | No. 1 | No. 2 | No. 3 | No. 4 | No. 5 | No. 6 |
|---|---|---|---|---|---|---|
| F1 (MHz) | 80 | 110 | 130 | 150 | 170 | 190 |
| F2 (MHz) | 110 | 130 | 150 | 170 | 190 | 210 |
| F3 (MHz) | 95 | 120 | 140 | 160 | 180 | 200 |
| t1 (mm) | 0.021 | 0.015 | 0.013 | 0.011 | 0.01 | 0.009 |
| t2 (mm) | 0.015 | 0.013 | 0.011 | 0.01 | 0.009 | 0.008 |
| t3 (mm) | 0.018 | 0.014 | 0.012 | 0.01 | 0.009 | 0.008 |
| a (mm) | 0.82 | 0.7 | 0.62 | 0.55 | 0.48 | 0.43 |

TABLE 2-continued

|  | No. 1 | No. 2 | No. 3 | No. 4 | No. 5 | No. 6 |
|---|---|---|---|---|---|---|
| b (mm) | 0.59 | 0.51 | 0.45 | 0.39 | 0.35 | 0.32 |
| a/t1 | 39.3 | 46.1 | 48.3 | 49.4 | 48.9 | 48.9 |
| a/t2 | 54 | 54.5 | 55.7 | 56 | 54.6 | 54.1 |
| b/t1 | 28.3 | 33.6 | 35 | 35 | 35.6 | 36.4 |
| b/t2 | 38.9 | 39.7 | 40.4 | 39.7 | 39.8 | 40.2 |

Further, assuming that the length of the first excitation electrode 31 along the X-axis direction is a (mm), the value a is determined by the vibration frequency. Assuming t3=t, it is preferable for the values a and t to fulfill the following relationship as shown in FIG. 3.

$$(-1049 \times t + 57) \leq (a/t) \leq (-64.4 \times t + 57)$$

Further, assuming that the length of the first excitation electrode 31 along the Z'-axis direction is b (mm), the value b is determined by the vibration frequency. Assuming t3=t, it is preferable for the values b and t to fulfill the following relationship as shown in FIG. 4.

$$(-823 \times t + 42) \leq (b/t) \leq (-120 \times t + 42)$$

By fulfilling these relationships, the vibration element 1 capable of stably exerting superior vibration characteristics can be obtained.

It should be noted that if both of the values of (a/t) and (b/t) are lower than the lower limit value described above, the area of the first excitation electrode 31 becomes excessively small, and as described later, in the case of incorporating the vibration element 1 into an oscillator 100, it becomes difficult to fulfill the variable characteristics of the oscillator 100 in some cases depending on the value of t. On the other hand, if both of the values of (a/t) and (b/t) exceed the upper limit value described above, the unwanted spurious frequency occurs near the resonant frequency and it is impossible to obtain the vibrating element 1 capable of stably exerting superior vibration characteristics in some cases depending on the value of t.

The unwanted spurious frequency can be kept sufficiently far from the resonant frequency by both of the values of (a/t) and (b/t) fulfilling the relationship described above will be shown based on an experimental result. In the experiment, the vibration element 1 in the same condition as those in Sample 1 was used except the size (the values of a, b) of the first excitation electrode 31, and seven types of Samples 5 through 11 different in size (the values of a, b) of the first excitation electrode 31 from each other were manufactured. Then, the frequency difference Δf between the unwanted spurious frequency and the resonant frequency was obtained with respect for each of the seven samples. The result is shown in Table 3 below. It should be noted that the numerical values shown in Table 3 each represent the average value of ten samples with respect to each of Samples 5 through 11.

TABLE 3

|  | a (mm) | b (mm) | a/t | b/t | Δf (ppm) |
|---|---|---|---|---|---|
| Sample 5 | 0.50 | 0.35 | 47 | 33 | 1700 |
| Sample 6 | 0.50 | 0.40 | 47 | 37 | 1450 |
| Sample 7 | 0.55 | 0.39 | 51 | 36 | 1400 |
| Sample 8 | 0.50 | 0.45 | 47 | 42 | 1300 |
| Sample 9 | 0.55 | 0.44 | 51 | 41 | 1350 |
| Sample 10 | 0.60 | 0.43 | 56 | 40 | 1300 |
| Sample 11 | 0.55 | 0.49 | 51 | 46 | 1100 |

Table 3 shows that the unwanted spurious frequency can be kept sufficiently far from the resonant frequency by both of the values of (a/t) and (b/t) fulfilling the relationship described above.

The vibration element 1 has been hereinabove explained. In the vibration element 1 according to the present embodiment, the vibrating section 21 is formed by forming the recessed section on the +Y'-axis side of the substrate 2, and further, the thick-wall section 23 is formed of the first thick-wall section 24 located on the +X-axis side with respect to the vibrating section 21 and the second thick-wall section 25 located on the +Z'-axis side. However, it is also possible to adopt a configuration obtained by flipping this configuration. Specifically, it is also possible that the vibrating section 21 is formed by forming the recessed section on the −Y'-axis side of the substrate 2, and further, the thick-wall section 23 is formed of the first thick-wall section 24 located on the +X-axis side with respect to the vibrating section 21 and the second thick-wall section 25 located on the −Z'-axis side. According also to such a configuration, substantially the same advantage (in particular the advantage that the width of the tilt sections 24a, 25a can be decreased) as in the present embodiment can be exerted.

Modified Example 1 through Modified Example 8 of the vibration element 1 according to the first embodiment of the invention will now be explained.

Hereinafter, an explanation will be presented mainly focused on the differences from the first embodiment described above, and the explanation of substantially the same matters will be omitted. Further, the constituents that are substantially the same as those of the first embodiment are denoted by the same reference symbols.

Modified Example 1

Firstly, Modified Example 1 of the vibration element 1 according to the first embodiment of the invention will now be explained.

Figure 5:
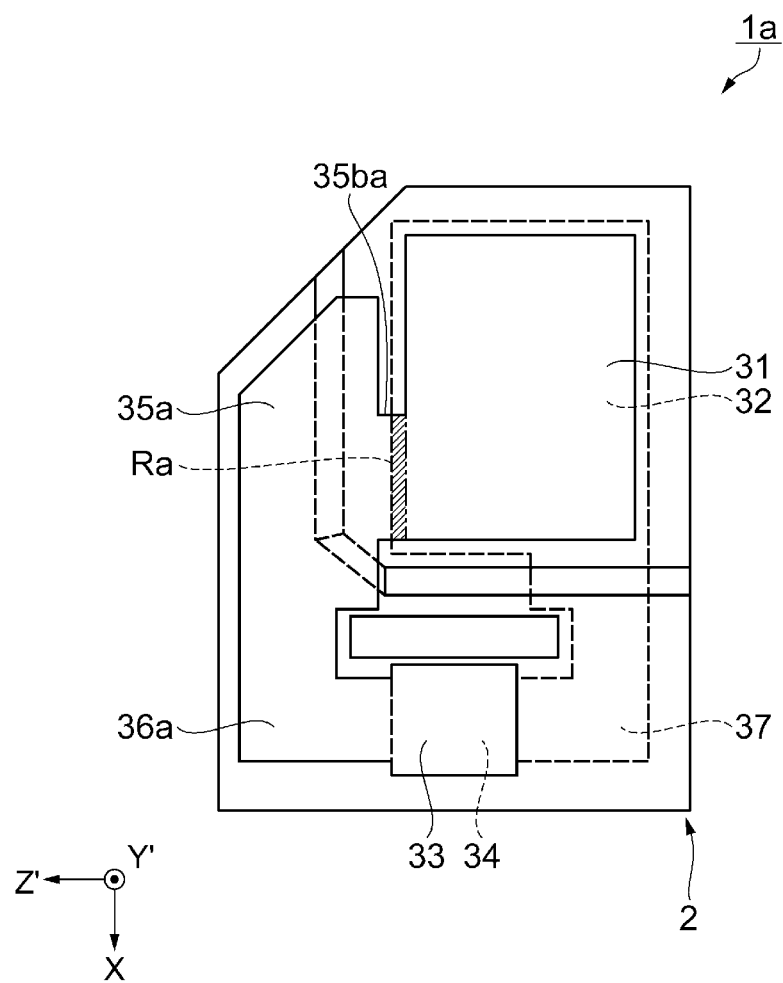
FIG. 5 is a schematic plan view showing a modified example 1 of the vibration element shown in FIGS. 1A through 1C.

FIG. 5 is a schematic plan view showing a schematic configuration of a vibration element according to Modified Example 1 of the invention.

The vibration element 1a according to Modified Example 1 is different from the vibration element 1 explained in the description of the first embodiment in the arrangement position of the second electrode section 35ba constituting the first extraction electrode 36a. Compared to the arrangement position of the second electrode section 35b of the vibration element 1 explained in the description of the first embodiment, the second electrode section 35ba is disposed on the end portion side of the first excitation electrode 31 located on the +X-axis side.

By adopting such an arrangement configuration as described above, substantially the same advantage as in the first embodiment described above can be exerted.

Modified Example 2

Modified Example 2 of the vibration element 1 according to the first embodiment of the invention will now be explained.

Figure 6:
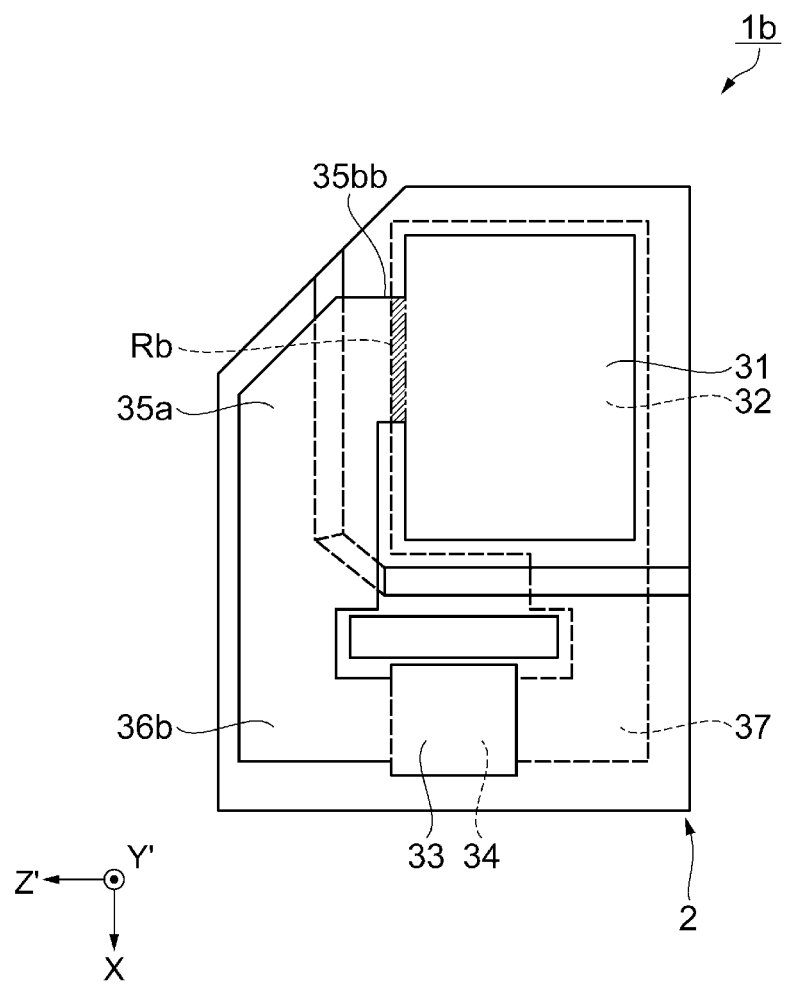
FIG. 6 is a schematic plan view showing a modified example 2 of the vibration element shown in FIGS. 1A through 1C.

FIG. 6 is a schematic plan view showing a schematic configuration of a vibration element according to Modified Example 2 of the invention.

The vibration element 1b according to Modified Example 2 is different from the vibration element 1 explained in the description of the first embodiment in the arrangement position of the second electrode section 35bb constituting the first extraction electrode 36b. Compared to the arrangement position of the second electrode section 35b of the vibration element 1 explained in the description of the first embodiment, the second electrode section 35bb is disposed on the end portion side of the first excitation electrode 31 located on the −X-axis side.

By adopting such an arrangement configuration as described above, substantially the same advantage as in the first embodiment described above can be exerted.

Modified Example 3

Modified Example 3 of the vibration element 1 according to the first embodiment of the invention will now be explained.

Figure 7:
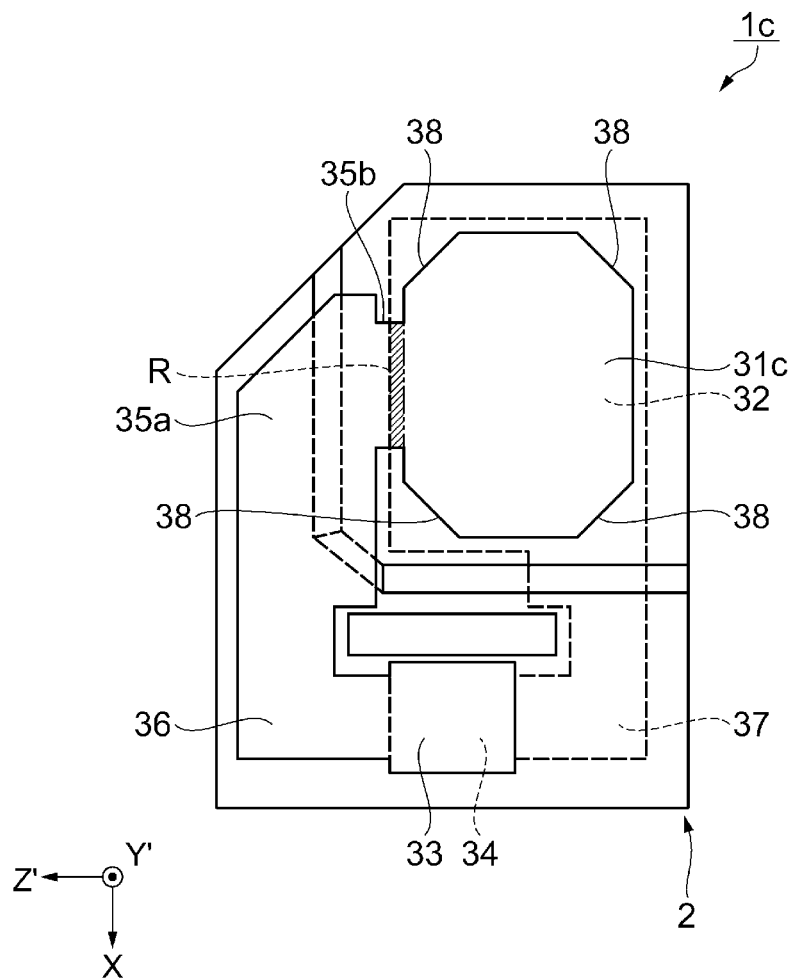
FIG. 7 is a schematic plan view showing a modified example 3 of the vibration element shown in FIGS. 1A through 1C.

FIG. 7 is a schematic plan view showing a schematic configuration of a vibration element according to Modified Example 3 of the invention.

The vibration element 1c according to Modified Example 3 is different from the vibration element 1 explained in the description of the first embodiment in the shape of the first excitation electrode 31c. Compared to the first excitation electrode 31 of the vibration element 1 explained in the description of the first embodiment, in the first excitation electrode 31c, outer edge sections 38 on the four corners are each connected to a straight line along a direction intersecting with both of the X-axis direction and the Z'-axis direction, and thus the first excitation electrode 31c is formed to have an octagon shape in the planar view.

By providing such a shape to the first excitation electrode 31c, since the electrodes on the four corners not making a contribution to the vibration are eliminated, the equivalent parallel capacitance C0 generated between the first excitation electrode 31c and the second excitation electrode can be reduced while keeping the equivalent serial capacitance C1. Therefore, the vibration element 1c exerting substantially the same advantage as in the first embodiment described above, and at the same time, low in the capacitance ratio γ can be obtained.

Modified Example 4

Modified Example 4 of the vibration element 1 according to the first embodiment of the invention will now be explained.

Figure 8:
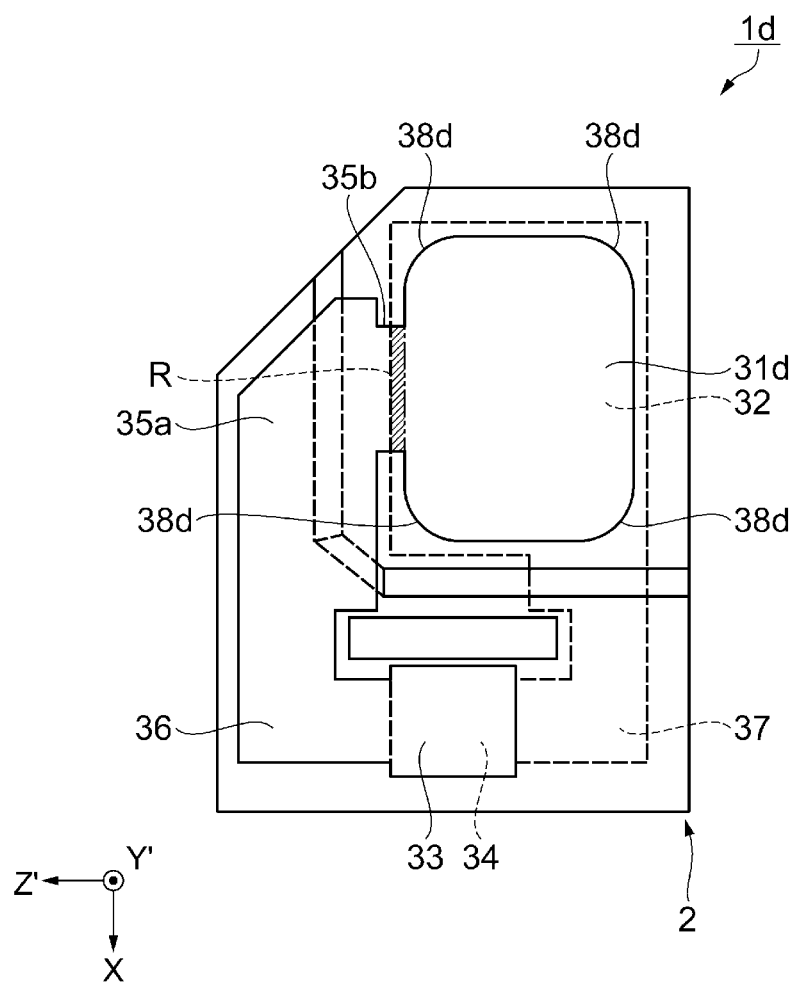
FIG. 8 is a schematic plan view showing a modified example 4 of the vibration element shown in FIGS. 1A through 1C.

FIG. 8 is a schematic plan view showing a schematic configuration of a vibration element according to Modified Example 4 of the invention.

The vibration element 1d according to Modified Example 4 is different from the vibration element 1 explained in the description of the first embodiment in the shape of the first excitation electrode 31d. Compared to the first excitation electrode 31 of the vibration element 1 explained in the description of the first embodiment, in the first excitation electrode 31d, outer edge sections 38d on the four corners are each formed of a curved line having a circular arc shape in a direction intersecting with both of the X-axis direction and the Z'-axis direction, and thus the first excitation electrode 31d is formed to have a roughly elliptical shape in the planar view.

By providing such a shape to the first excitation electrode 31d, since the electrodes on the four corners not making a contribution to the vibration are eliminated, the equivalent parallel capacitance C0 generated between the first excitation electrode 31d and the second excitation electrode can be reduced while keeping the equivalent serial capacitance C1. Therefore, the vibration element 1d exerting substantially the same advantage as in the first embodiment described above, and at the same time, low in the capacitance ratio γ can be obtained.

Modified Example 5

Modified Example 5 of the vibration element 1 according to the first embodiment of the invention will now be explained.

Figure 9:
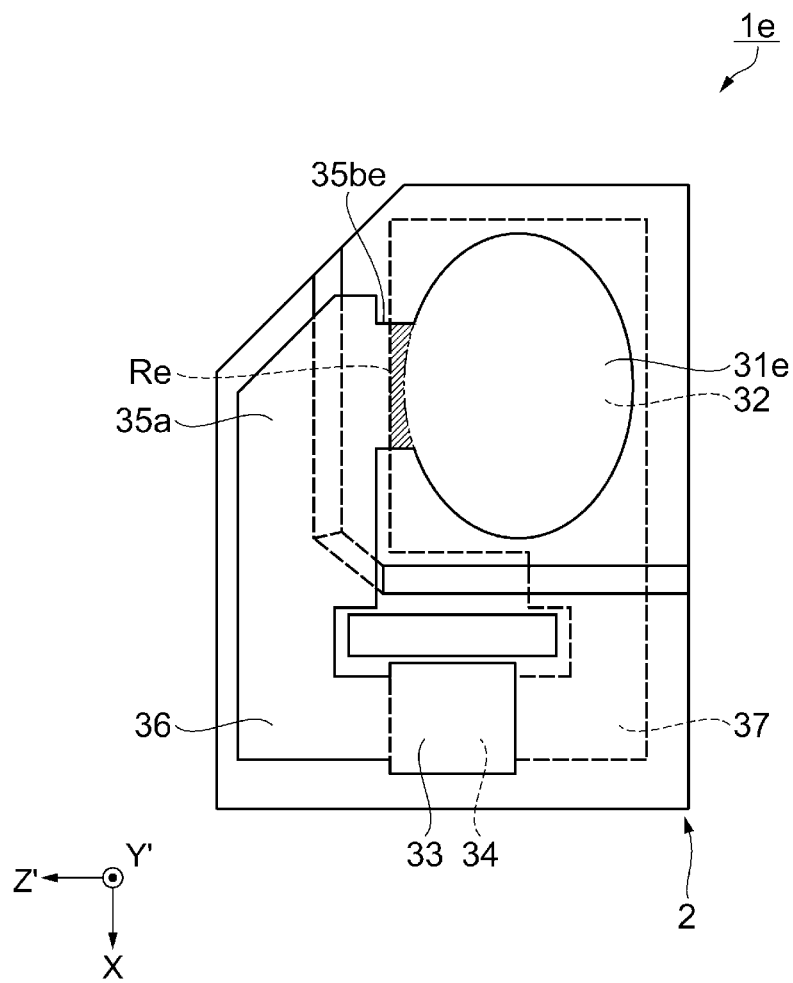
FIG. 9 is a schematic plan view showing a modified example 5 of the vibration element shown in FIGS. 1A through 1C.

FIG. 9 is a schematic plan view showing a schematic configuration of a vibration element according to Modified Example 5 of the invention.

The vibration element 1e according to Modified Example 5 is different from the vibration element 1 explained in the description of the first embodiment in the shape of the first excitation electrode 31e. Compared to the first excitation electrode 31 of the vibration element 1 explained in the description of the first embodiment, the first excitation electrode 31e is formed to have an elliptical shape in the planar view.

By providing such a shape to the first excitation electrode 31e, since the electrodes on the four corners not making a contribution to the vibration are eliminated, the equivalent parallel capacitance C0 generated between the first excitation electrode 31e and the second excitation electrode can be reduced while keeping the equivalent serial capacitance C1. Therefore, the vibration element 1e exerting substantially the same advantage as in the first embodiment described above, and at the same time, low in the capacitance ratio γ can be obtained.

Modified Example 6

Modified Example 6 of the vibration element 1 according to the first embodiment of the invention will now be explained.

Figure 10:
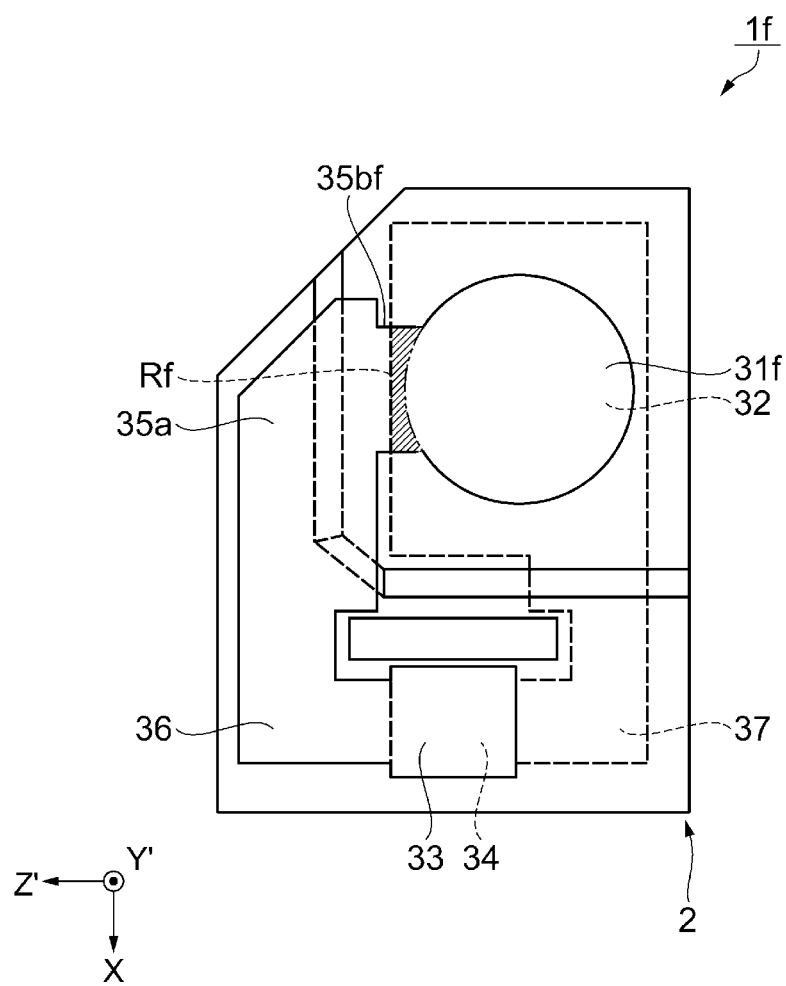
FIG. 10 is a schematic plan view showing a modified example 6 of the vibration element shown in FIGS. 1A through 1C.

FIG. 10 is a schematic plan view showing a schematic configuration of a vibration element according to Modified Example 6 of the invention.

The vibration element 1f according to Modified Example 6 is different from the vibration element 1 explained in the description of the first embodiment in the shape of the first excitation electrode 31f. Compared to the first excitation electrode 31 of the vibration element 1 explained in the description of the first embodiment, the first excitation electrode 31f is formed to have a circular shape in the planar view.

By providing such a shape to the first excitation electrode 31f, the vibration element 1f exerting substantially the same advantage as in the first embodiment described above can be obtained.

Modified Example 7

Modified Example 7 of the vibration element 1 according to the first embodiment of the invention will now be explained.

Figure 11:
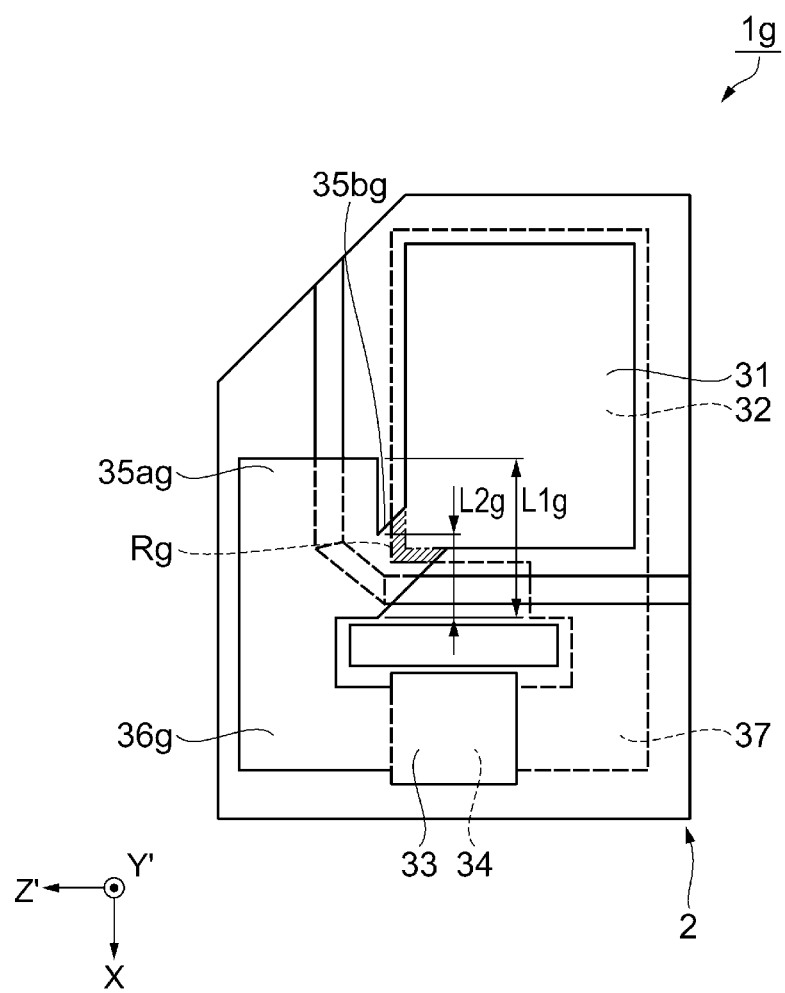
FIG. 11 is a schematic plan view showing a modified example 7 of the vibration element shown in FIGS. 1A through 1C.

FIG. 11 is a schematic plan view showing a schematic configuration of a vibration element according to Modified Example 7 of the invention.

The vibration element 1g according to Modified Example 7 is different from the vibration element 1 explained in the description of the first embodiment in the shape of the first extraction electrode 36g. Compared to the first extraction electrode 36 of the vibration element 1 explained in the description of the first embodiment, the first extraction electrode 36g is formed so that the width L1g of the first electrode section 35ag in the X-axis direction is shorter, and the second electrode section 35bg extends from the corner section, on which a +Z'-axis side end portion and a +X-axis side end portion of the first excitation electrode 31 intersect with each other, in an oblique direction (a direction between the +Z'-axis direction and the +X-axis direction).

By providing such a shape to the first extraction electrode 36g, it is possible to deal with miniaturization of the first excitation electrode 31, the second excitation electrode 32, and the substrate 2 due to an increase in frequency. Therefore, the vibration element 1g exerting substantially the same advantage as in the first embodiment described above, and at the same time, small in size can be obtained.

Modified Example 8

Modified Example 8 of the vibration element 1 according to the first embodiment of the invention will now be explained.

Figure 12:
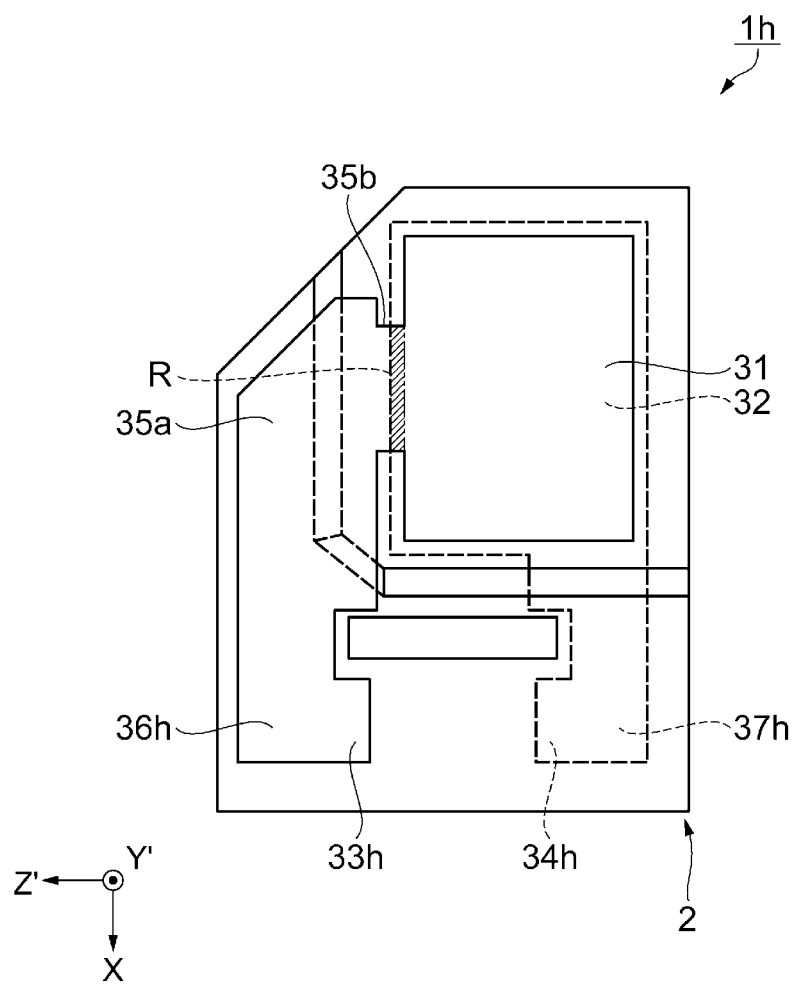
FIG. 12 is a schematic plan view showing a modified example 8 of the vibration element shown in FIGS. 1A through 1C.

FIG. 12 is a schematic plan view showing a schematic configuration of a vibration element according to Modified Example 8 of the invention.

The vibration element 1h according to Modified Example 8 is different from the vibration element 1 explained in the description of the first embodiment in the arrangement positions of the pad electrodes 33h, 34h. Compared to the pad electrodes 33, 34 of the vibration element 1 explained in the description of the first embodiment, the pad electrode 33h is disposed on the +Z'-axis side of the substrate 2, and the pad electrode 34h is disposed on the –Z'-axis side thereof, and the pad electrode 33h and the pad electrode 34h are formed so as not to overlap each other.

By adopting such an arrangement of the pad electrodes 33h, 34h, the capacitance between the pad electrodes 33h, 34h can be suppressed. Therefore, the vibration element 1h exerting substantially the same advantage as in the first embodiment described above, and at the same time, low in the capacitance ratio γ can be obtained.

Second Embodiment

A vibration element according to a second embodiment of the invention will now be explained.

Figure 13:
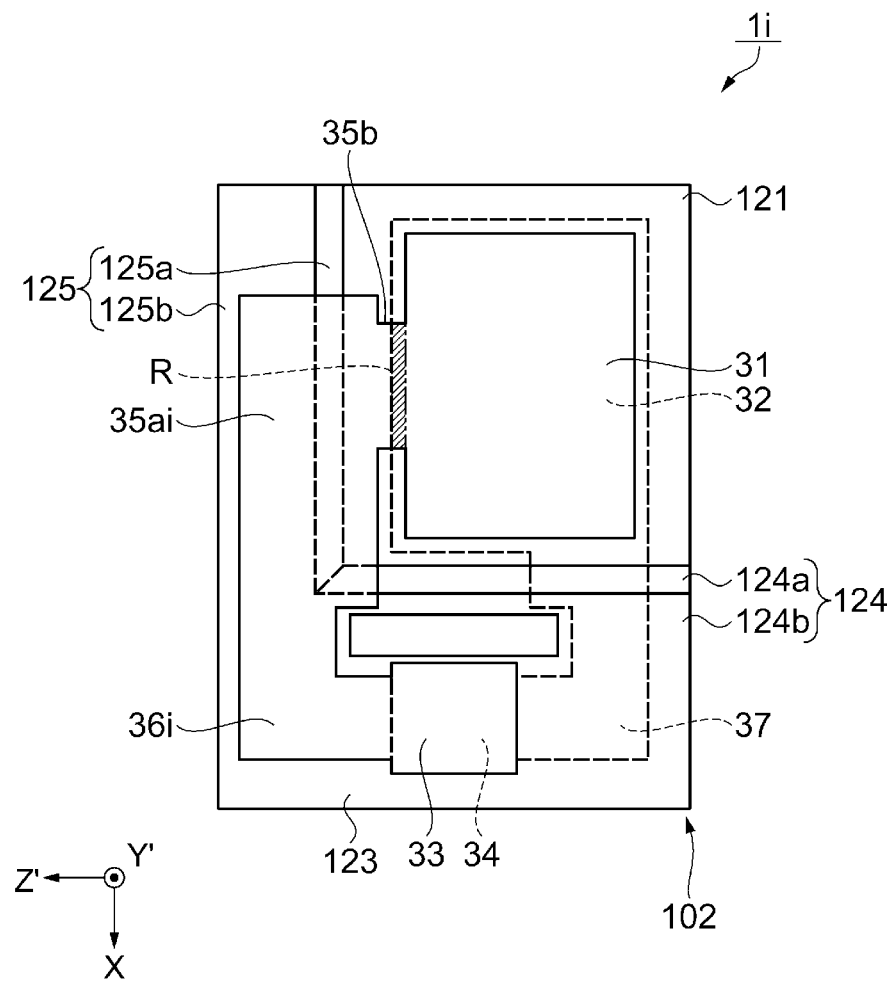
FIG. 13 is a schematic plan view showing a schematic configuration of a vibration element according to a second embodiment of the invention.

FIG. 13 is a schematic plan view showing a schematic configuration of a vibration element according to the second embodiment of the invention.

Hereinafter, the vibration element according to the second embodiment will be described with a focus mainly on the differences from the first embodiment described above, and the explanation regarding substantially the same matters will be omitted.

The vibration element according to the second embodiment of the invention is substantially the same as that of the first embodiment described above except the point that the configuration of the thick-wall section is different. It should be noted that the constituents that are substantially the same as those of the first embodiment described above are denoted with the same reference symbols.

As shown in FIG. 13, in the vibration element 1i according to the present embodiment, the thick-wall section 123 includes a first thick-wall section 124, and a second thick-wall section 125 disposed so as to extend to the –X-axis side outer edge of the vibrating section 121 along the +Z'-axis side outer edge of the vibrating section 121. Therefore, the thick-wall section 123 has a roughly L shape along the vibrating section 121. The thick-wall section 123 is not formed along the –X-axis side outer edge and the –Z'-axis side outer edge of the vibrating section 121, and the −X-axis side outer edge and the −Z'-axis outer edge of the vibrating section 121 are exposed from the thick-wall section 123. As described above, by forming the thick-wall section 123 to have the roughly L shape, miniaturization of the vibration element 1i can be achieved, and at the same time, the rigidity of the vibration element 1i (the vibrating section 121) can be increased, and thus, the unwanted spurious frequency can be effectively prevented from occurring.

According also to such a second embodiment as described above, substantially the same advantages as in the first embodiment described above can be obtained.

Third Embodiment

A vibration element according to a third embodiment of the invention will now be explained.

Figure 14:
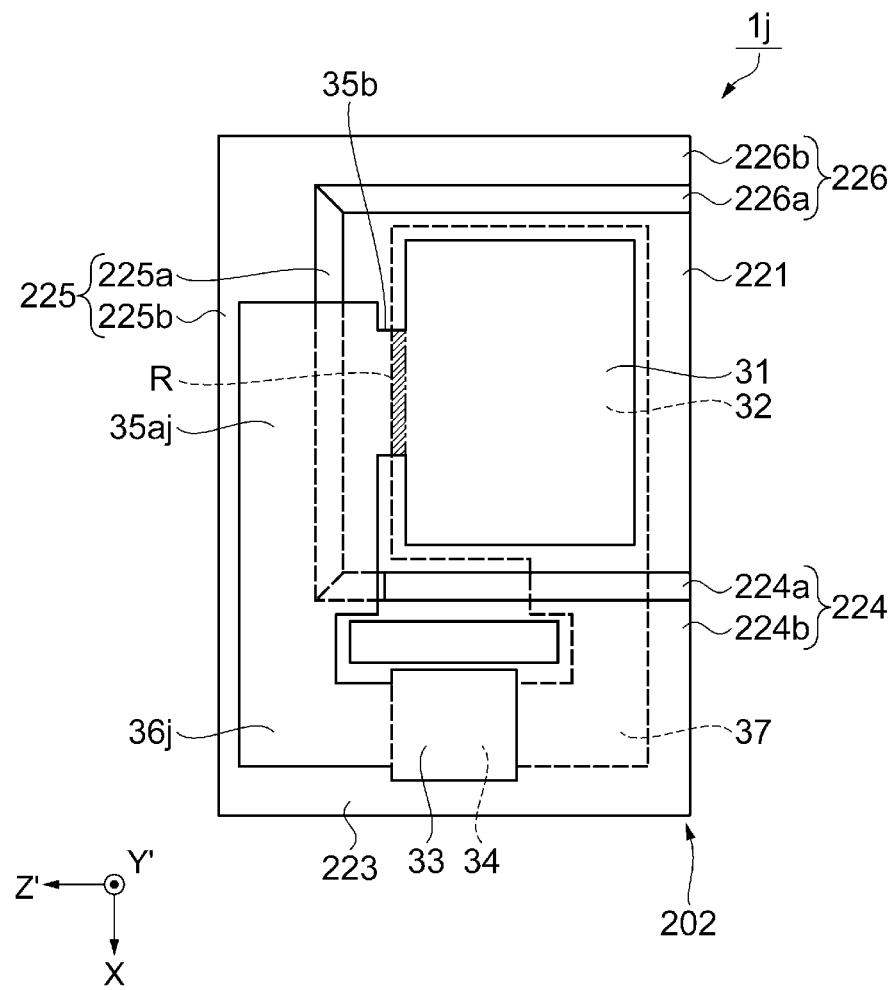
FIG. 14 is a schematic plan view showing a schematic configuration of a vibration element according to a third embodiment of the invention.

FIG. 14 is a schematic plan view showing a schematic configuration of the vibration element according to the third embodiment of the invention.

Hereinafter, the vibration element according to the third embodiment will be described with a focus mainly on the differences from the first embodiment described above, and the explanation regarding substantially the same matters will be omitted.

The vibration element according to the third embodiment of the invention is substantially the same as that of the first embodiment described above except the point that the configuration of the thick-wall section is different. It should be noted that the constituents that are substantially the same as those of the first embodiment described above are denoted with the same reference symbols.

As shown in FIG. 14, in the vibration element 1j according to the present embodiment, the thick-wall section 223 further includes a third thick-wall section 226 disposed along the −X-axis side outer edge of the vibrating section 221 and connected to the second thick-wall section 225 in addition to the first thick-wall section 224 and the second thick-wall section 225. Therefore, the thick-wall section 223 has a roughly bracket shape along the vibrating section 221. The thick-wall section 223 is not formed along the −Z'-axis side outer edge of the vibrating element 221, and the −Z'-axis side outer edge of the vibrating section 221 is exposed from the thick-wall section 223. As described above, by forming the thick-wall section 223 to have the roughly bracket shape, miniaturization of the vibration element 1j can be achieved, and at the same time, the rigidity of the vibration element 1j (the vibrating section 221) can further be increased, and thus, the unwanted spurious frequency can be effectively prevented from occurring.

The third thick-wall section 226 is provided with the tilted section (a residual section) 226a disposed contiguously with the −X-axis side outer edge of the vibrating section 221 and gradually increasing in the thickness in the −X-axis direction, and the thick-wall section main body 226b disposed contiguously with the −X-axis direction side edge of the tilted section 226a and having roughly constant thickness.

According also to such a third embodiment as described above, substantially the same advantages as in the first embodiment described above can be obtained.

Fourth Embodiment

A vibration element according to a fourth embodiment of the invention will now be explained.

Figure 15:
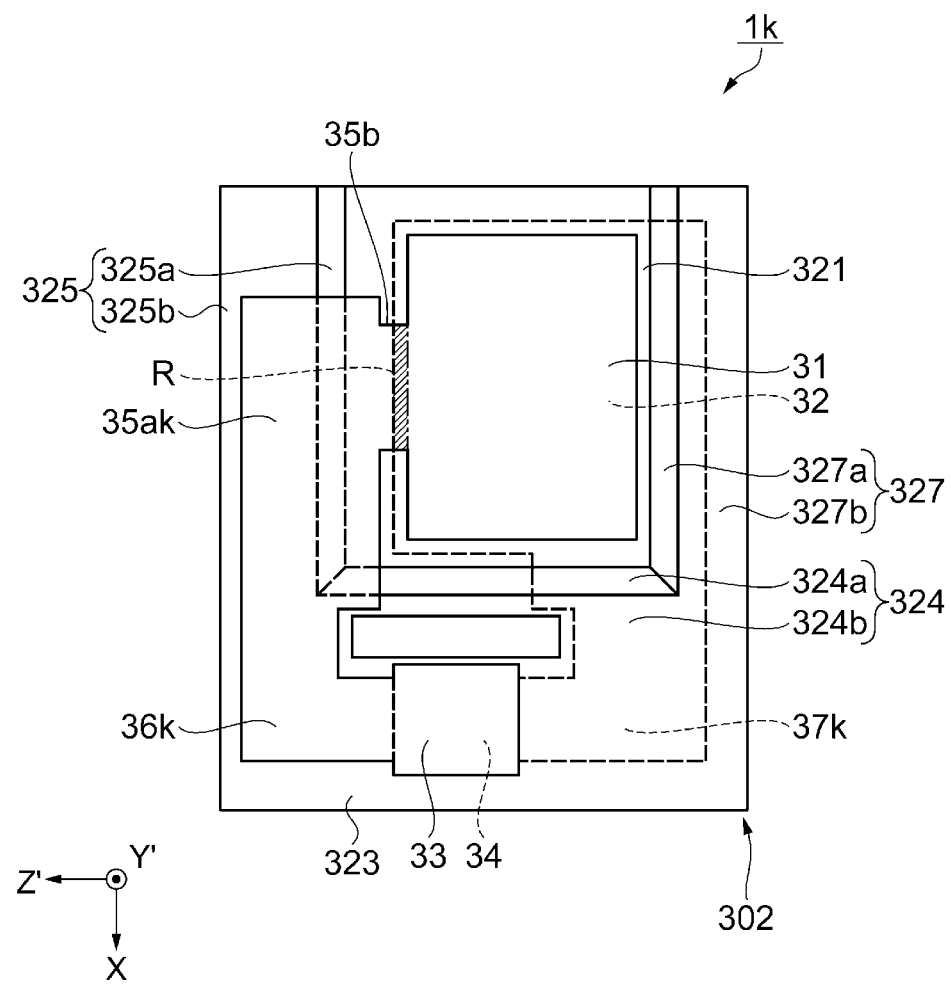
FIG. 15 is a schematic plan view showing a schematic configuration of a vibration element according to a fourth embodiment of the invention.

FIG. 15 is a schematic plan view showing a schematic configuration of the vibration element according to the fourth embodiment of the invention.

Hereinafter, the vibration element according to the fourth embodiment will be described with a focus mainly on the differences from the first embodiment described above, and the explanation regarding substantially the same matters will be omitted.

The vibration element according to the fourth embodiment of the invention is substantially the same as that of the first embodiment described above except the point that the configuration of the thick-wall section is different. It should be noted that the constituents that are substantially the same as those of the first embodiment described above are denoted with the same reference symbols.

As shown in FIG. 15, in the vibration element 1k according to the present embodiment, the thick-wall section 323 further includes a fourth thick-wall section 327 disposed along the −Z'-axis side outer edge of the vibrating section 321 and connected to the first thick-wall section 324 in addition to the first thick-wall section 324 and the second thick-wall section 325. Therefore, the thick-wall section 323 has a roughly bracket shape along the vibrating section 321, and the −X-axis side outer edge of the vibrating section 321 is exposed from the thick-wall section 323. As described above, by forming the thick-wall section 323 to have the roughly bracket shape, miniaturization of the vibration element 1k can be achieved, and at the same time, the rigidity of the vibration element 1k (the vibrating section 321) can further be increased, and thus, the unwanted spurious frequency can be effectively prevented from occurring.

The fourth thick-wall section 327 is provided with the tilted section (a residual section) 327a disposed contiguously with the −Z'-axis side outer edge of the vibrating section 321 and gradually increasing in the thickness in the −Z'-axis direction, and the thick-wall section main body 327b disposed contiguously with the −Z'-axis direction side edge of the tilted section 327a and having roughly constant thickness.

According also to such a fourth embodiment as described above, substantially the same advantages as in the first embodiment described above can be exerted.

Fifth Embodiment

A vibration element according to a fifth embodiment of the invention will now be explained.

Figure 16:
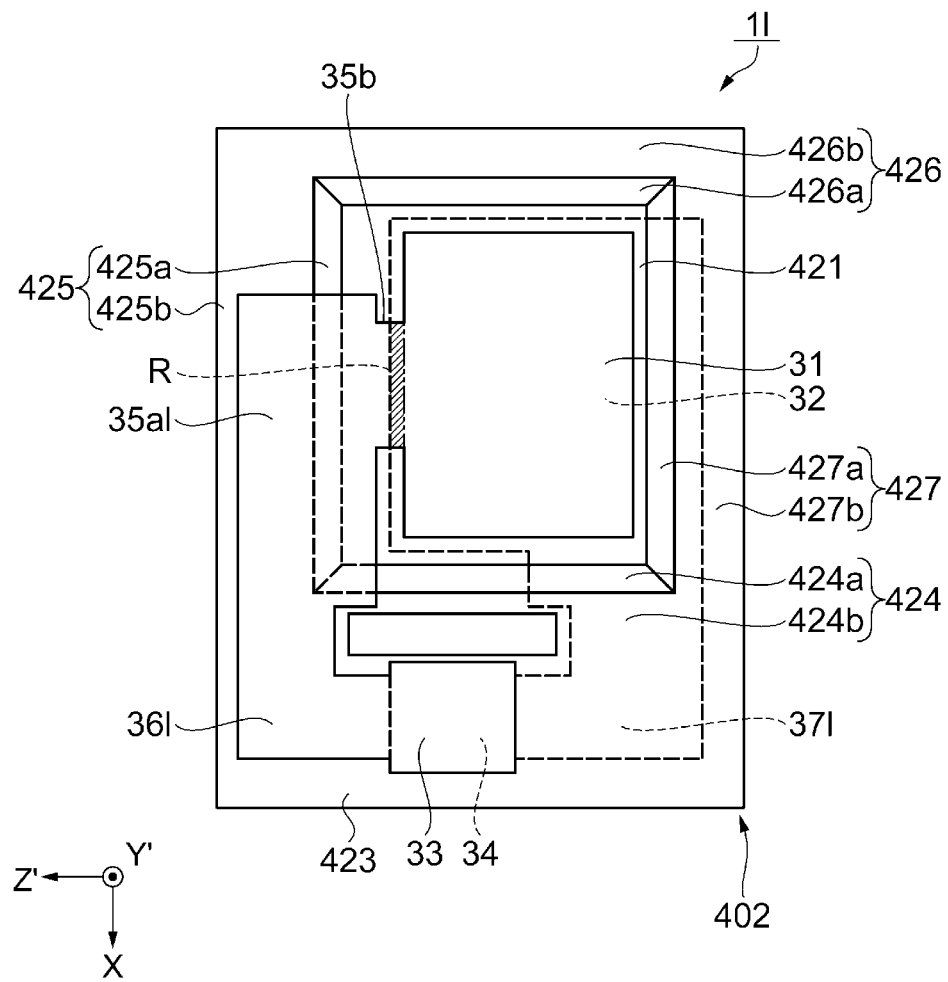
FIG. 16 is a schematic plan view showing a schematic configuration of a vibration element according to a fifth embodiment of the invention.

FIG. 16 is a schematic plan view showing a schematic configuration of the vibration element according to the fifth embodiment of the invention.

Hereinafter, the vibration element according to the fifth embodiment will be described with a focus mainly on the differences from the first embodiment described above, and the explanation regarding substantially the same matters will be omitted.

The vibration element according to the fifth embodiment of the invention is substantially the same as that of the first embodiment described above except the point that the configuration of the thick-wall section is different. It should be noted that the constituents that are substantially the same as those of the first embodiment described above are denoted with the same reference symbols.

As shown in FIG. 16, in the vibration element 1*l* according to the present embodiment, the thick-wall section 423 further includes a third thick-wall section 426 disposed along the −X-axis side outer edge of the vibrating section 421 and connected to the second thick-wall section 425, and a fourth thick-wall section 427 disposed along the −Z'-axis side outer edge of the vibrating section 421 and connected to the first thick-wall section 424 in addition to the first thick-wall section 424 and the second thick-wall section 425. Therefore, the thick-wall section 423 has a roughly rectangular frame shape along the entire circumference of the vibrating section 421, and the outer edge of the vibrating section 421 is not exposed from the thick-wall section 423. As described above, by forming the thick-wall section 423 to have the roughly rectangular frame shape, the rigidity of the vibration element 1*l* (the vibrating section 421) can further be increased, and thus, the unwanted spurious frequency can be effectively prevented from occurring.

The third thick-wall section 426 is provided with the tilted section (a residual section) 426*a* disposed contiguously with the −X-axis side outer edge of the vibrating section 421 and gradually increasing in the thickness in the −X-axis direction, and the thick-wall section main body 426*b* disposed contiguously with the −X-axis direction side edge of the tilted section 426*a* and having roughly constant thickness.

The fourth thick-wall section 427 is provided with the tilted section (a residual section) 427*a* disposed contiguously with the −Z'-axis side outer edge of the vibrating section 421 and gradually increasing in the thickness in the −Z'-axis direction, and the thick-wall section main body 427*b* disposed contiguously with the −Z'-axis direction side edge of the tilted section 427*a* and having roughly constant thickness.

According also to such a fifth embodiment as described above, substantially the same advantages as in the first embodiment described above can be obtained.

Sixth Embodiment

A vibration element according to a sixth embodiment of the invention will now be explained.

Figure 17A:
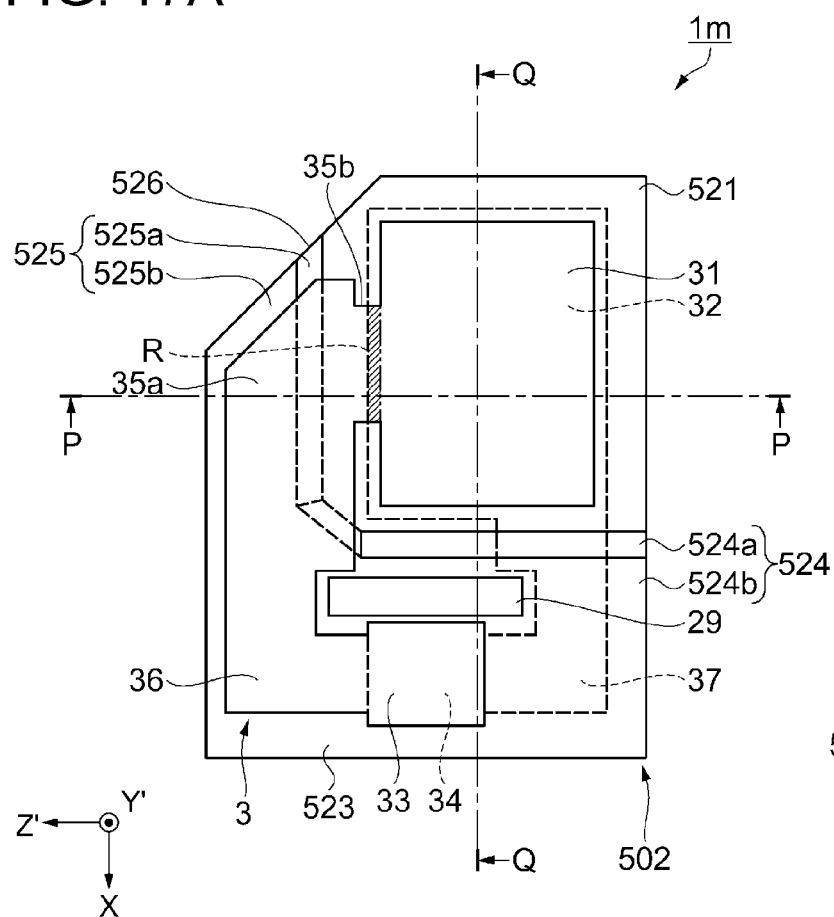
Figure 17C:
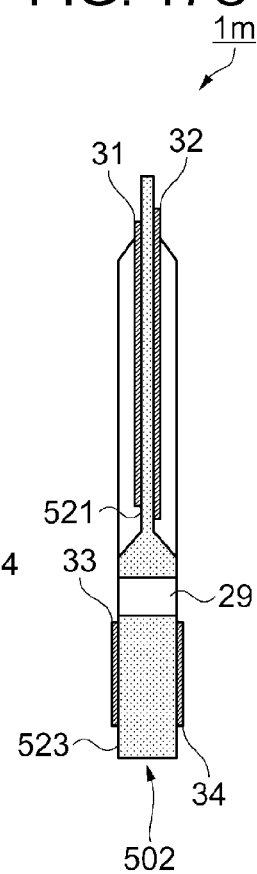
Figure 17B:
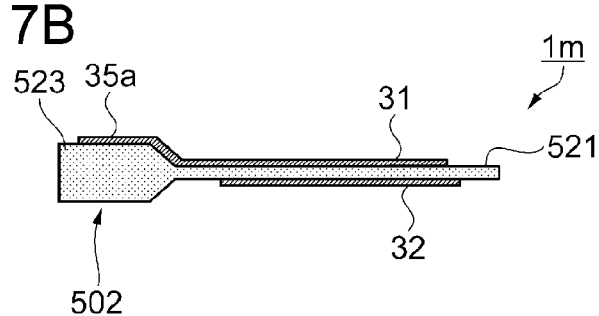

FIGS. 17A through 17C show a schematic configuration of a vibration element according to the sixth embodiment of the invention, wherein FIG. 17A is a schematic plan view of the vibration element, FIG. 17B is a schematic cross-sectional view along the P-P line in FIG. 17A, and FIG. 17C is a schematic cross-sectional view along the Q-Q line in FIG. 17A.

Hereinafter, the vibration element according to the sixth embodiment will be described with a focus mainly on the differences from the first embodiment described above, and the explanation regarding substantially the same matters will be omitted.

The vibration element according to the sixth embodiment of the invention is substantially the same as that of the first embodiment described above except the point that the configuration of the vibrating section is different. It should be noted that the constituents that are substantially the same as those of the first embodiment described above are denoted with the same reference symbols.

As shown in FIGS. 17A through 17C, in the vibration element 1*m* according to the present embodiment, by forming the recessed section on both principal surface of the substrate 502, the vibrating section 521 is formed. In other words, the obverse surface (the principal surface on the +Y'-axis direction side) of the thick-wall section 523 is disposed so as to project toward the +Y'-axis direction side from the obverse surface (the principal surface on the +Y'-axis direction side) of the vibration section 521, and the reverse surface (the principal surface on the −Y'-axis direction side) of the thick-wall section 523 is disposed so as to project toward the −Y'-axis direction side from the reverse surface (the principal surface on the −Y'-axis direction side) of the vibrating section 521. As described above, by forming the vibrating section 521 by forming the recessed section on both of the principal surfaces of the substrate 502, the etching depth of the recessed section can be made shallower compared to, for example, the first embodiment described above. Therefore, the etching can be more accurately performed, and thus, the outer shape of the substrate 502 can be more accurately obtained.

According also to such a sixth embodiment as described above, substantially the same advantages as in the first embodiment described above can be obtained.

Vibrator

A vibrator to which the vibration element 1 described above is applied will now be explained.

Figure 18:
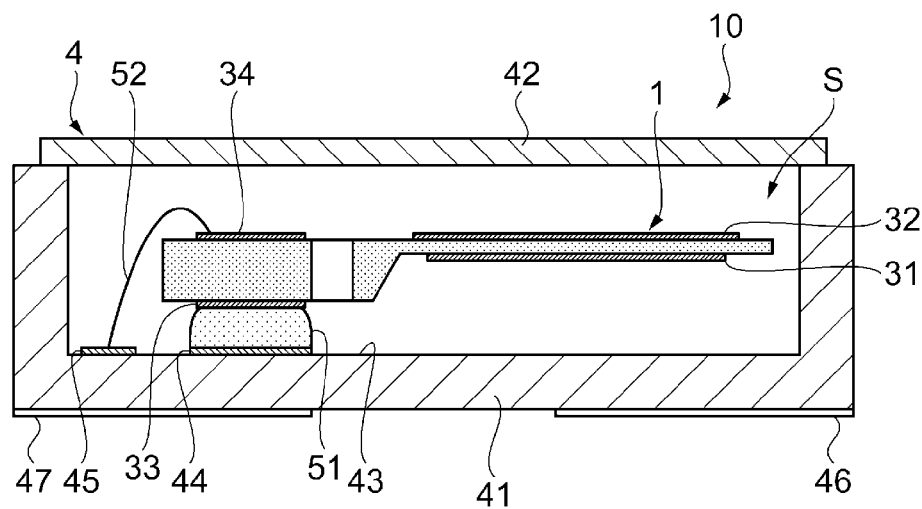
FIG. 18 is a schematic cross-sectional view showing a schematic configuration of a vibrator according to an embodiment of the invention.

FIG. 18 is a schematic cross-sectional view showing the vibrator according to a preferred embodiment of the invention.

The vibrator 10 shown in FIG. 18 has the vibration element 1 described above and a package 4 for housing the vibration element 1.

Package

The package 4 has a base 41 having a box shape provided with a recessed section 43 opened upward, and a lid 42 having a plate shape and bonded to the base 41 so as to block the opening of the recessed section 43. Further, the vibration element 1 is housed in a housing space S formed by the recessed section 43 blocked by the lid 42. The housing space S can be kept in a reduced-pressure (vacuum) state, or filled with an inert gas such as nitrogen, helium, or argon.

The constituent material of the base 41 is not particularly limited, but a variety of types of ceramics such as aluminum oxide can be used therefor. Further, the constituent material of the lid 42 is not particularly limited, but a member with a linear expansion coefficient similar to that of the constituent material of the base 41 is preferable. For example, if the ceramics described above is used as the constituent material of the base 41, an alloy such as kovar is preferably used. It should be noted that bonding between the base 41 and the lid 42 is not particularly limited, but it is possible to adopt bonding with an adhesive, or to adopt bonding with seam welding.

Internal terminals 44, 45 are formed on a bottom surface of the recessed section 43 of the base 41. Further, a plurality of external mounting terminals 46, 47 is formed on a lower surface of the base 41. The internal terminal 44 is electrically connected to the external mounting terminal 46 via a through electrode (not shown) provided to the base 41, and the internal terminal 45 is electrically connected to the external mounting terminal 47 via a through electrode (not shown) provided to the base 41.

The configuration of the internal terminals 44, 45 and the external mounting terminals 46, 47 is not particularly limited provided that each of the terminals has an electrical conductively, but each of the terminals can be formed of a metal coating obtained by stacking a coat made of, for example, Ni (nickel), Au (gold), Ag (silver), or Cu (copper) on a metalization layer (a foundation layer) made of, for example, Cr (chromium), or W (tungsten).

The vibration element 1 housed inside the housing space S is fixed to the base 41 with an electrically-conductive adhesive 51 in an area where the pad electrode 33 is formed so that the obverse surface faces to the base 41. The electrically-conductive adhesive 51 is disposed so as to have contact with the internal terminal 44 and the pad electrode 33. Thus, the internal terminal 44 and the pad electrode 33 are electrically connected to each other via the electrically-conductive adhesive 51. By supporting the vibration element 1 at one place (one point) using the electrically-conductive adhesive 51, the stress caused in the vibration element 1 by a difference in thermal expansion coefficient between the base 41 and the substrate 2, for example, can be suppressed.

The electrically-conductive adhesive 51 is not particularly limited provided that an electrically-conductive property and an adhesive property are provided, and there can be used a material obtained by dispersing electrically-conductive filler in an adhesive such as a silicone adhesive, an epoxy adhesive, an acrylic adhesive, a polyimide adhesive, or a bismaleimide adhesive.

The pad electrode 34 of the vibration element 1 is electrically connected to the internal terminal 45 via a bonding wire 52. As described above, the pad electrode 34 is disposed so as to be opposed to the pad electrode 33, and is therefore located immediately above the electrically-conductive adhesive 51 in the state in which the vibration element 1 is fixed to the base 41. Therefore, the leakage of the vibration (ultrasonic vibration) provided to the pad electrode 34 when performing the wire bonding can be suppressed, and thus, the connection of the bonding wire 52 to the pad electrode 34 can be more reliably performed. It should be noted that although in the present embodiment, the side of the substrate 2 on which the pad electrode 33 is formed is fixed to the base 41 using the electrically-conductive adhesive 51, it is also possible to fix the side, on which the pad electrode 34 is formed, to the base 41.

Oscillator

An oscillator to which the vibrator 10 is applied will now be explained.

Figure 19:
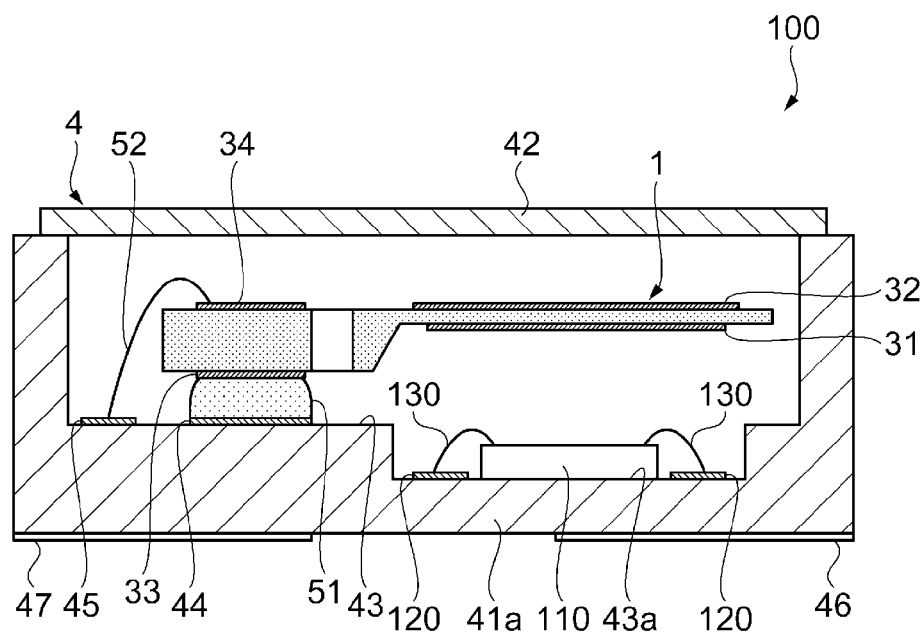
FIG. 19 is a schematic cross-sectional view showing a schematic configuration of an oscillator according to an embodiment of the invention.

FIG. 19 is a schematic cross-sectional view showing the oscillator according to a preferred embodiment of the invention.

The oscillator 100 shown in FIG. 19 has the vibrator 10 and an IC chip 110 for driving the vibration element 1. Hereinafter, the oscillator 100 will now be explained with a focus mainly on the differences from the vibrator 10 described above, and the explanations regarding substantially the same matters will be omitted.

As shown in FIG. 19, in the oscillator 100, the IC chip 110 is fixed to a recessed section 43a of the base 41a. The IC chip 110 is electrically connected to a plurality of internal terminals 120 formed on the bottom surface of the recessed section 43a via bonding wires 130. The plurality of internal terminals 120 includes those connected to the internal terminals 44, 45 and those connected to the external mounting terminals 46, 47. The IC chip 110 has an oscillation circuit for controlling drive of the vibration element 1. By driving the vibration element 1 with the IC chip 110, a signal with a predetermined frequency can be taken out.

For example, the oscillator 100 is a voltage-controlled oscillator, and will hereinafter be explained in detail.

In general, the voltage-controlled oscillator is composed of the vibration element 1, an oscillator circuit section such as the IC component 110, and a control voltage terminal including a variable capacity diode as an electronic component, and so on, and has a pull range, in which the oscillation frequency of the vibration element 1 is varied in accordance with the control voltage, as an important specification. Since the pull range is the sum of the absolute pull range (APR) necessary for transmission communication equipment and the frequency tolerance (a frequency variation due to the frequency tolerance, frequency-temperature characteristic, and the power supply voltage, a frequency variation due to the load, a frequency variation due to reflow, and a frequency variation due to aging), the voltage controlled oscillator compensates the frequency variation amount due to the variation of the external environment of the oscillator and the oscillator circuit condition by itself. Therefore, the fact that the broad pull range can be provided is vary important for improving the production yield of the voltage-controlled oscillator since the frequency tolerance due to the manufacture and the design can be eased.

Here, the pulling sensitivity S of the voltage-controlled oscillator is expressed as the formula (1) described below.

$$S = -\Delta CL / (2 \times \gamma \times C0 \times (1 + CL/C0)^2) \tag{1}$$

Here, ΔCL denotes a load capacitance variation, γ denotes the capacitance ratio (C0/C1), C0 denotes an equivalent parallel capacitance, and CL denotes a load capacitance.

According to the formula (1), if the load capacitance CL constituted by the oscillator circuit is constant, the pulling sensitivity S is determined by the equivalent parallel capacitance C0 of the vibration element 1 and the capacitance ratio γ, and in particular, the influence of the capacitance ratio γ is significant. Therefore, by using the vibration element 1 low in capacitance ratio γ, the pulling sensitivity S of the voltage-controlled oscillator can be increased, and thus, the voltage-controlled oscillator large in pull range can be obtained.

Further, since the generation of the unwanted spurious frequency near the resonant frequency of the vibration element 1 is reduced, there is an advantage that the voltage-controlled oscillator good in S/N ratio can be obtained.

Electronic Apparatus

An electronic apparatus to which the vibrator 10 (the vibration element 1) is applied will now be explained.

Figure 20:
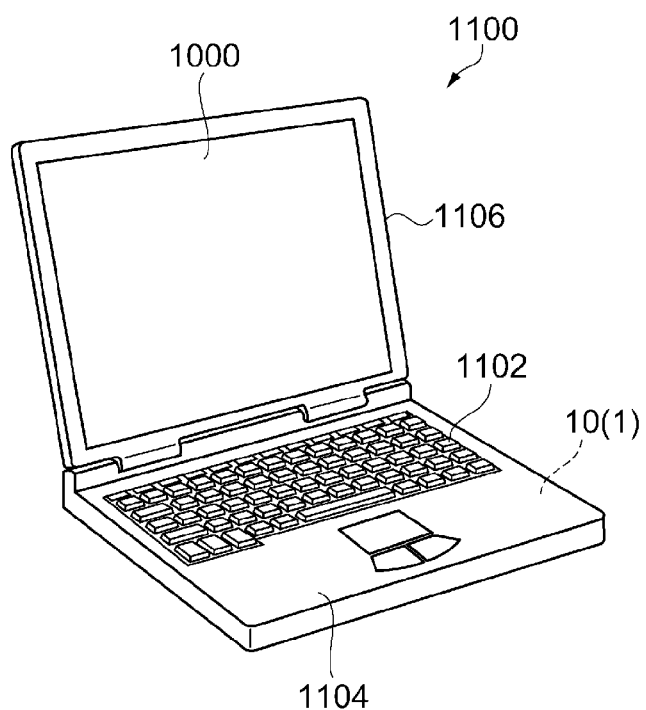
FIG. 20 is a perspective view showing a configuration of a mobile type (or laptop type) of personal computer as an example of the electronic apparatus equipped with the vibration element according to an embodiment of the invention.

FIG. 20 is a perspective view showing a configuration of a mobile type (or laptop type) of personal computer as an embodiment of an electronic instrument according to the invention. In the drawing, the personal computer 1100 includes a main body section 1104 provided with a keyboard 1102, and a display unit 1106 provided with a display section 1000, and the display unit 1106 is pivotally supported with respect to the main body section 1104 via a hinge structure section. Such a personal computer 1100 incorporates the vibrator 10 (the vibration element 1) functioning as a filter, a resonator, a reference clock, and so on.

Figure 21:
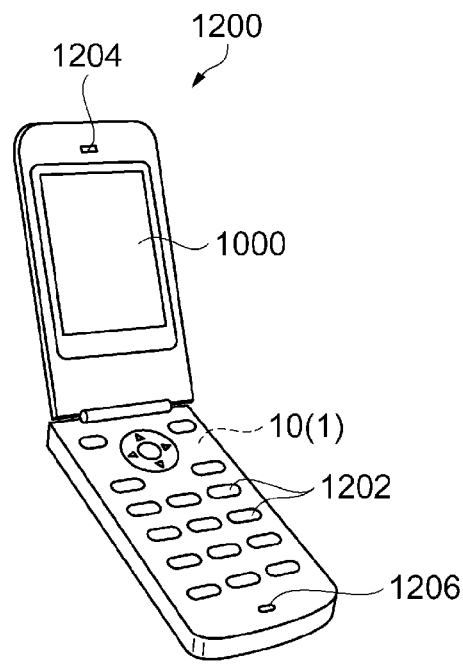
FIG. 21 is a perspective view showing a configuration of a cellular phone (including PHS) as an example of the electronic apparatus equipped with the vibration element according to an embodiment of the invention.

FIG. 21 is a perspective view showing a configuration of a cellular phone (including PHS) as an embodiment of the electronic instrument according to the invention. In this drawing, the cellular phone 1200 is provided with a plurality of operation buttons 1202, an ear piece 1204, and a mouthpiece 1206, and the display section 1000 is disposed between the operation buttons 1202 and the ear piece 1204. Such a cellular phone 1200 incorporates the vibrator 10 (the vibration element 1) functioning as a filter, a resonator, and so on.

Figure 22:
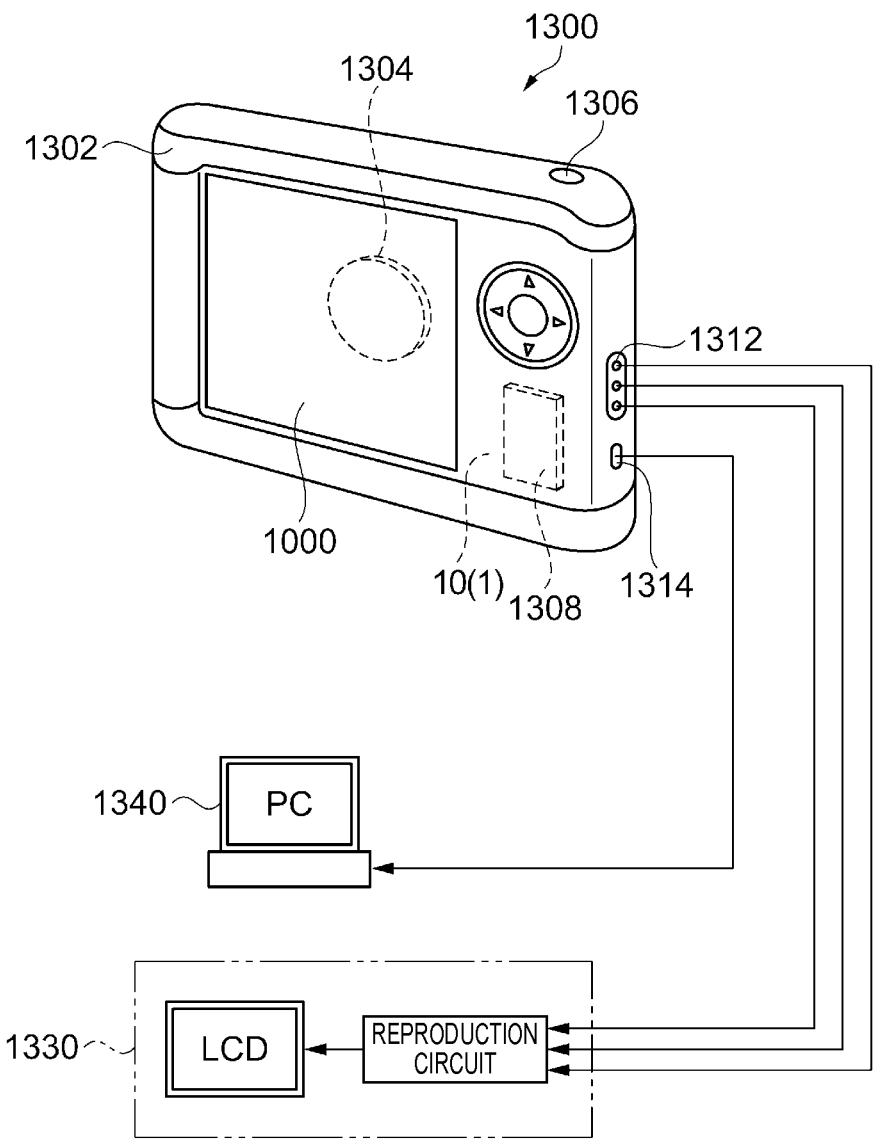
FIG. 22 is a perspective view showing a configuration of a digital still camera as an example of the electronic apparatus equipped with the vibration element according to an embodiment of the invention.

FIG. 22 is a perspective view showing a configuration of a digital still camera as an embodiment of the electronic instrument according to the invention. It should be noted that the connection with external equipment is also shown briefly in this drawing. It should be noted that typical cameras expose silver salt films to optical images of objects on the one hand, the digital still camera 1300 performs photoelectric conversion of optical images of the objects by imaging elements such as CCD (charge coupled device) to generate imaging signals (image signals).

The case (body) 1302 of the digital still camera 1300 is provided with a display section 1000 disposed on the back surface thereof to have a configuration of performing display in accordance with the imaging signal from the CCD, wherein the display section 1000 functions as a viewfinder for displaying the objects as electronic images. Further, the front surface (the back side in the drawing) of the case 1302 is provided with a light receiving unit 1304 including an optical lens (an imaging optical system), the CCD, and so on.

When the photographer checks an object image displayed on the display section 1000, and then holds down a shutter button 1306, the imaging signal from the CCD at that moment is transferred to and stored in a memory device 1308. Further, the digital still camera 1300 is provided with video signal output terminals 1312 and an input-output terminal 1314 for data communication disposed on a side surface of the case 1302. Further, as shown in the drawing, a television monitor 1330 and a personal computer 1340 are respectively connected to the video signal output terminals 1312 and the input-output terminal 1314 for data communication according to needs. Further, there is adopted the configuration in which the imaging signal stored in the memory device 1308 is output to the television monitor 1330 and the personal computer 1340 in accordance with a predetermined operation. Such a digital still camera 1300 incorporates the vibrator 10 (the vibration element 1) functioning as a filter, a resonator, and so on.

It should be noted that, as the electronic apparatus equipped with the vibration element, there can be cited, for example, an inkjet ejection device (e.g., an inkjet printer), a laptop personal computer, a television set, a video camera, a video cassette recorder, a car navigation system, a pager, a personal digital assistance (including one with communication function), an electronic dictionary, an electric calculator, a computerized game machine, a word processor, a workstation, a video phone, a security video monitor, a pair of electronic binoculars, a POS terminal, a medical device (e.g., an electronic thermometer, an electronic manometer, an electronic blood sugar meter, an electrocardiogram measurement instrument, an ultrasonograph, and an electronic endoscope), a fish detector, various types of measurement instruments, various types of gauges (e.g., gauges for a vehicle, an aircraft, or a ship), and a flight simulator, besides the personal computer (the mobile personal computer) shown in FIG. 20, the cellular phone shown in FIG. 21, and the digital still camera shown in FIG. 22.

Moving Object

A moving object to which the vibrator 10 (the vibration element 1) is applied will now be explained.

Figure 23:
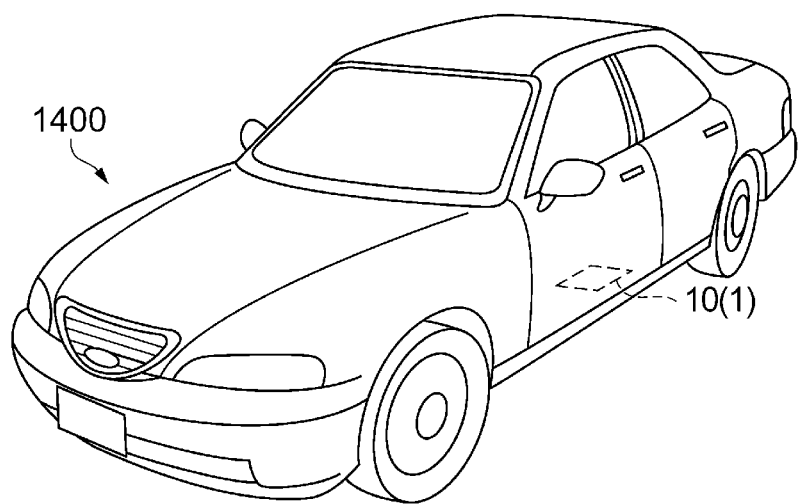
FIG. 23 is a perspective view schematically showing a vehicle as an example of a moving object equipped with the vibration element according to an embodiment of the invention.

FIG. 23 is a perspective view schematically showing a vehicle as an example of the mobile object. The vehicle 1400 is equipped with the vibrator 10 (the vibration element 1). The vibrator 10 can be widely applied to an electronic control unit (ECU) such as a keyless entry system, an immobilizer, a car navigation system, a car air-conditioner, an anti-lock braking system (ABS), an air-bag system, a tire pressure monitoring system (TPMS), an engine controller, a battery monitor for a hybrid car or an electric car, or a vehicle posture control system.

Although the vibration elements 1, 1a through 1m, the vibrator 10, the oscillator 100, the electronic apparatus, and the moving object are hereinabove explained based on the embodiments shown in the accompanying drawings, the invention is not limited thereto, but the configuration of each of the constituents can be replaced with one having an arbitrary configuration with an equivalent function. Further, it is also possible to add any other constituents to the invention. Further, it is also possible to arbitrarily combine any of the embodiments described above.

The entire disclosure of Japanese Patent Application No. 2014-146541 filed Jul. 17, 2014 is expressly incorporated by reference herein.

What is claimed is:

1. A vibration element comprising:
   a quartz crystal substrate having an X-axis, a Y'-axis, and a Z'-axis perpendicular to each other, and including a first principal surface and a second principal surface opposite to each other, the first principal surface and the second principal surface extending along the X-axis and the Z'-axis;
   a first excitation electrode disposed on the first principal surface;
   a second excitation electrode disposed on the second principal surface; and
   a first extraction electrode disposed on the first principal surface, and connected to the first excitation electrode,
   wherein the first extraction electrode includes a first electrode section, and a second electrode section extending from the first electrode section in a Z'-axis direction, the second electrode section being connected to the first excitation electrode,
   wherein the second electrode section is narrower in width in an X-axis direction intersecting with the Z'-axis direction than the first electrode section at a location where the second electrode section is connected to the first electrode section,
   the second electrode section has a length in the Z'-axis direction that is less than a length of the first electrode section in the Z'-axis direction,
   the first electrode section, the second electrode section, and the first excitation electrode are aligned in the Z'-axis direction in a plan view;
   wherein S1 is an area of the first excitation electrode, S2 is an area of an overlapping part where the second electrode section overlaps the second excitation electrode in the plan view, and $(S2/S1) \leq 0.1$; and
   when viewed along the Z'-axis direction, the entire width of the second electrode section in the X-axis direction is within the range of the width of the first excitation electrode in the X-axis direction.

2. The vibration element according to claim 1, wherein a length of the overlapping part along the Z'-axis direction is equal to or shorter than 20 μm.

3. The vibration element according to claim 1, wherein the first excitation electrode is disposed inboard of the second excitation electrode in the planar view.

4. The vibration element according to claim 1, wherein t is a thickness of the substrate, a is a length of the first excitation electrode along the X-axis direction, and $(-1049 \times t + 57) \leq (a/t) \geq (-64.4 \times t + 57)$.

5. The vibration element according to claim 3, wherein t is a thickness of the substrate, a is a length of the first excitation electrode along the X-axis direction, and $(-1049 \times t + 57) \leq (a/t) \leq (-64.4 \times t + 57)$.

6. The vibration element according to claim 1, wherein t is a thickness of the substrate, b is a length of the first excitation electrode along the Z'-axis direction, and $(-823 \times t + 42) \leq (b/t) \leq (-120 \times t + 42)$.

7. The vibration element according to claim 3, wherein t is a thickness of the substrate, b is a length of the first excitation electrode along the Z'-axis direction, and $(-823 \times t + 42) \leq (b/t) \leq (-120 \times t + 42)$.

8. The vibration element according to claim 4, wherein t is a thickness of the substrate, b is a length of the first excitation electrode along the Z'-axis direction, and $(-823 \times t + 42) \leq (b/t) \leq (-120 \times t + 42)$.

9. The vibration element according to claim 5, wherein t is a thickness of the substrate, b is a length of the first excitation electrode along the Z'-axis direction, and $(-823 \times t + 42) \leq (b/t) \leq (-120 \times t + 42)$.

10. A vibrator comprising:
the vibration element according to claim 1; and
a package housing the vibration element.

11. A vibrator comprising:
the vibration element according to claim 2; and
a package housing the vibration element.

12. An oscillator comprising:
the vibration element according to claim 1; and
a circuit operably driving the vibration element.

13. An oscillator comprising:
the vibration element according to claim 2; and
a circuit operably driving the vibration element.

14. An electronic apparatus comprising:
the vibration element according to claim 1.

15. An electronic apparatus comprising:
the vibration element according to claim 2.

16. A moving object comprising:
the vibration element according to claim 1.

17. A moving object comprising:
the vibration element according to claim 2.

\* \* \* \* \*